United States Patent [19]

Adachi et al.

[11] Patent Number: 5,492,843

[45] Date of Patent: Feb. 20, 1996

[54] METHOD OF FABRICATING SEMICONDUCTOR DEVICE AND METHOD OF PROCESSING SUBSTRATE

[75] Inventors: Hiroki Adachi; Yuugo Goto; Hongyong Zhang; Toru Takayama, all of Kanagawa, Japan

[73] Assignee: Semiconductor Energy Laboratory Co., Ltd., Kanagawa, Japan

[21] Appl. No.: 282,598

[22] Filed: Jul. 29, 1994

[30] Foreign Application Priority Data

Jul. 31, 1993 [JP] Japan ................................ 5-209053
Jul. 31, 1993 [JP] Japan ................................ 5-209055
Sep. 20, 1993 [JP] Japan ................................ 5-256569

[51] Int. Cl.$^6$ .......................... H01L 21/84; H01L 21/324
[52] U.S. Cl. .......................... 437/21; 437/248; 437/909; 437/174; 148/DIG. 16; 117/106
[58] Field of Search .............................. 437/248, 40, 41, 437/21, 101, 173, 174, 907, 909; 65/117, 41; 117/94, 106; 148/DIG. 16, DIG. 90

[56] References Cited

U.S. PATENT DOCUMENTS

| 3,250,605 | 5/1966 | Matsumoto et al. ...................... | 65/117 |
| 4,152,535 | 5/1979 | Deminet et al. ........................ | 437/248 |
| 4,547,256 | 10/1985 | Gurtler et al. ........................... | 437/248 |
| 4,709,466 | 12/1987 | McCandless et al. . | |
| 4,851,363 | 7/1989 | Troxell et al. ............................ | 437/40 |
| 4,894,080 | 1/1990 | Reese et al. . | |
| 4,977,748 | 12/1990 | Diedrich . | |
| 5,064,775 | 11/1991 | Chang ........................................ | 437/40 |
| 5,112,764 | 5/1992 | Mitra et al. .............................. | 437/40 |

(List continued on next page.)

FOREIGN PATENT DOCUMENTS

| 58-114037 | 7/1983 | Japan . | |
| 2-102150 | 4/1990 | Japan . | |
| 5-186235 | 7/1993 | Japan ...................................... | 65/117 |

OTHER PUBLICATIONS

Translation of JP 2-102150 (Hamano).
Translation of JP 58-114037 (Masumoto).
C. Hayzelden et al., "In Situ Transmission Electron Microscopy Studies of Silicide-Mediated Crystallization of Amorphous Silicon" (3 pages), Appl. Phys. Lett., 60 (1992) 22.5.
A. V. Dvurechenskii et al., "Transport Phenomena in Amorphous Silicon Doped by Ion Implantation of 3d Metals", Akademikian Lavrentev Prospekt pp. 635–640 Phys Stat Sol. A95 (1986).
T. Hempel et al., "Needle-Like Crystallization of Ni Doped Amorphous Silicon Thin Films", Solid State Communications, vol. 85, No. 11, pp. 921–924, 1993.

Primary Examiner—Brian E. Hearn
Assistant Examiner—Leon Radomsky
Attorney, Agent, or Firm—Sixbey, Friedman, Leedom & Ferguson; Gerald J. Ferguson, Jr.

[57] ABSTRACT

Method of fabricating a semiconductor device. A glass substrate such as Corning 7059 is used as a substrate. A bottom film is formed. Then, the substrate is annealed above the strain point of the glass substrate. The substrate is then slowly cooled below the strain point. Thereafter, a silicon film is formed, and a TFT is formed. The aforementioned anneal and slow cooling reduce shrinkage of the substrate created in later thermal treatment steps. This makes it easy to perform mask alignments. Furthermore, defects due to misalignment of masks are reduced, and the production yield is enhanced. In another method, a glass substrate made of Corning 7059 is also used as a substrate. The substrate is annealed above the strain point. Then, the substrate is rapidly cooled below the strain point. Thereafter, a bottom film is formed, and a TFT is fabricated. The aforementioned anneal and slow cooling reduce shrinkage of the substrate created in later thermal treatment steps. Thus, less cracks are created in the active layer of the TFT and in the bottom film. This improves the production yield. During heating of the substrate, it is held substantially horizontal to reduce warpage, distortions, and waviness of the substrate.

41 Claims, 15 Drawing Sheets

U.S. PATENT DOCUMENTS

| | | |
|---|---|---|
| 5,147,826 | 9/1992 | Liu et al. . |
| 5,252,140 | 10/1993 | Kobayashi et al. ............ 437/4 |
| 5,254,208 | 10/1993 | Zhang . |
| 5,262,654 | 11/1993 | Yamazaki . |
| 5,275,851 | 1/1994 | Fonash et al. . |
| 5,294,238 | 3/1994 | Fukada et al. . |
| 5,297,956 | 3/1994 | Yanabe et al. . |
| 5,306,651 | 4/1994 | Masumo et al. ............ 437/40 |
| 5,308,998 | 5/1994 | Yamazaki et al. . |
| 5,403,772 | 3/1995 | Zhang et al. ............ 437/101 |
| 5,426,064 | 6/1995 | Zhang et al. ............ 437/40 |

FIG. 10

| PREHEATING PROCESS OF SUBSTRATE AT 640°C FOR 4 HOURS | HEATING ANNEAL AT 600°C FOR 4 HOURS | SUBSTRATE SHRINKAGE (ppm) |
|---|---|---|
| SLOW COOLING (0.2°C/min) | RAPID COOLING 50°C/min | FROM LESS THAN LIMIT OF MEASURE TO 44 |
| | USUAL COOLING (1~2°C/min) | FROM 60 TO 90 |
| | SLOW COOLING (0.2°C/min) | 300 |

METHOD OF FABRICATING SEMICONDUCTOR DEVICE AND METHOD OF PROCESSING SUBSTRATE

FIELD OF THE INVENTION

The present invention relates to a method of fabricating a semiconductor device such as a thin-film transistor (TFT) or a thin-film diode (TFD) on an insulating substrate made of glass, for example, or on various other substrates. The invention also relates to a method of fabricating a thin-film integrated circuit utilizing such devices and, more particularly, to a method of fabricating a thin-film integrated circuit for an active-matrix liquid crystal display.

BACKGROUND OF THE INVENTION

A thin-film transistor (TFT) is known as a thin-film semiconductor device fabricated on a glass substrate. TFTs formed on such a glass substrate are disposed in a pixel driver portion and also in a peripheral circuit for a liquid crystal display and are used to display images with high information content. Furthermore, these TFTs are employed in image sensors and in other integrated circuits.

Where a glass substrate is used, the following advantages can be derived:

(1) Since it is optically transparent to visible light, the glass substrate can be easily utilized in an apparatus such as a liquid crystal display through which light is transmitted.

(2) It is inexpensive.

However, the upper limit of the thermal treatment temperature is restricted by the heatproofness, i.e., the maximum usable temperature, of the glass substrate.

Corning 7059 glass is generally used as a glass substrate because of deposition of impurities, prices, and other problems. The transition point of this glass is 628° C. and the strain point is 593° C. Other known practical industrial glass materials having strain points of 550°–650° C. are listed in Table 1.

TABLE 1

|  | 7059D (CGW) | 7059F (CGW) | 1733 (CGW) | LE30 (HOYA) | TRC5 (OHARA) | E-8 (OHARA) |
|---|---|---|---|---|---|---|
| strain point (°C.) | 593 | 593 | 640 | 625 |  | 643 |
| thermal expansion coefficient ($\times 10^{-7}$) | 50.1 | 50.1 | 36.5 | 38.0 | 52.0 | 37.0 |
| transmission (%) | 89.5 (400 nm) | 89.5 (400 nm) | 91.9 (400 nm) | 90.0 (450 nm) | N.A. | 91.0 (450 nm) |
| composition |  |  |  |  |  |  |
| $SiO_2$ | 49 | 49 | 57 | 60 |  | 59 |
| $Al_2O_3$ | 10 | 10 | 16 | 15 |  | 15 |
| $B_2O_3$ | 15 | 15 | 11 | 6 |  | 7 |
| $R_2O$ |  |  | 0.1 | 2 |  | 1 |

|  | N-0 (NEG) | OA2 (NEG) | AN1 (AGC) | AN2 (AGC) | NA35 (HOYA) | NA45 (HOYA) |
|---|---|---|---|---|---|---|
| strain point (°C.) |  | 625 | 625 | 616 | 650 | 610 |
| thermal expansion coefficient ($\times 10^{-7}$) | −7.0 | 38.0 | 44.0 | 47.0 | 39.0 | 48.0 |
| transmission (%) | N.A. | 90.0 (450 nm) | 90.0 (500 nm) | 89.8 (500 nm) | N.A. | N.A. |
| composition |  |  |  |  |  |  |
| $SiO_2$ |  | 60 | 56 | 53 |  | 51 |
| $Al_2O_3$ |  | 15 | 15 | 11 |  | 11 |
| $B_2O_3$ |  | 6 | 2 | 12 |  | 13 |
| $R_2O$ |  | 2 | 0.1 | 0.1 |  | 0.1 |

Where an amorphous silicon film formed on a glass substrate by CVD is crystallized by heating, a high temperature, e.g., above 600° C., is needed. Therefore, where a Corning 7059 glass substrate is used, the substrate is shrunk by the heating.

An active-matrix liquid crystal display is known as an apparatus utilizing TFTs formed on a glass substrate. To fabricate this liquid crystal display, it is necessary to form tens of thousands to several millions of TFTs on the glass substrate in rows and column. To manufacture the TFTs, processes using numerous masks are necessitated. Consequently, shrinkage of the substrate is a great impediment to the manufacturing process.

Especially, where it is necessary to make a mask alignment before thermal treatment, substrate shrinkage caused by the thermal treatment is a problem.

In a process for heat-treating substrates, it is common practice to place these plural substrates in vertical posture within a heating furnace, taking account of the processing speed. Where the substrates are heated above their strain point, warpage of the substrates is conspicuous.

In recent years, semiconductor devices having TFTs on a glass substrate or on other insulating substrate, e.g., an active-matrix liquid crystal display using TFTs for driving pixels and image sensors, have been developed.

As the glass substrate, Corning 7059 glass is generally used taking the price problem and the problem of impurity precipitation from the glass substrate into consideration. The Corning 7059 glass has a transition temperature of 628° C. and a strain point of 593° C. Other known industrial glass materials having a strain point of 550° to 650° C. are shown in Table 1 above.

TFTs used in these devices are generally made of silicon semiconductor in the form of a thin film. Silicon semiconductors in the form of a thin film are roughly classified into amorphous silicon semiconductors (a—Si) and crystalline silicon semiconductors. Amorphous silicon semiconductors are fabricated at low temperatures and can be fabricated relatively easily by CVD. Hence, they are adapted for mass production. In consequence, they are used most commonly. However, they are inferior in physical properties such as electrical conductivity to crystalline silicon semiconductors. Therefore, in order to obtain higher-speed characteristics, it is eagerly required that a method of fabricating TFTs consisting of crystalline silicon semiconductor be established. It is known that crystalline silicon semiconductors include polycrystalline silicon, crystallite silicon, amorphous silicon containing crystalline components, and semi-amorphous silicon having a state midway between crystalline state and amorphous state.

One known method of obtaining these crystalline thin films of silicon semiconductor consists of forming an amorphous thin semiconductor film and applying thermal energy to the film for a long time by thermal annealing to crystallize the amorphous film. This method requires that the substrate be heated above 600° C. As a result, the substrate irreversibly shrinks. After a patterning step, it is impossible to perform this processing at such a high temperature. Furthermore, the heating step required for crystallization persists for as long as tens of hours. Therefore, it is necessary to shorten the heating time.

In relation to these problems, it has been recently discovered that addition of some metal element acting as a catalyst for promoting crystallization lowers the crystallization temperature and shortens the crystallization time. It has been confirmed that Fe, Co, Ni, Ru, Rh, Pd, Os, Ir, Pt, Sc, Ti, V, Cr, Mn, Cu, Zn, Au, and Ag are catalytic metal elements that are effective in promoting crystallization.

If these elements are introduced uniformly over the whole surface of a silicon film, crystals grow perpendicularly to the film, i.e., in the direction of the film thickness. However, if they are introduced into a certain portion and crystallization is caused, a crystallized region grows to the surroundings from this certain portion, i.e., grows laterally. A silicon film crystallized in this way exhibits a higher field mobility than that of a silicon film in which a catalytic metal element has been introduced uniformly.

In order to introduce such a catalytic metal element selectively, a patterning step must be carried out before a thermal annealing step for crystallization. The aforementioned shrinkage of the substrate may cause the pattern of the introduced catalytic metal element to deviate from patterns of other elements and circuits greatly. FIGS. 4(A)–4(C) show an example in which TFTs are fabricated, using the means described above. A region 402 indicated by one broken line in FIG. 4(A) shows a position at which an active layer, or a silicon film, should be patterned. A region 403 indicated by another broken line in FIG. 4(A) shows a position at which a gate electrode should be patterned. A rectangular region 401 indicated by the solid line shows a pattern in which a catalytic metal element should be introduced.

In this scheme, if a thermal annealing step is effected after a catalytic metal element has been introduced, then an elliptical region 404 shown in FIG. 4(B) is crystallized. That is, the region 404 is a laterally crystallized region. The size of this ellipse depends on the concentration of the catalytic metal element, on the thermal annealing time, and on the thermal annealing temperature. As shown in FIG. 4(B), if the gate electrode and the active region are formed in position, then channel formation regions of TFTs are formed inside the laterally crystallized region and so no problems take place. In practice, however, thermal annealing results in shrinkage of the substrate. In consequence, the gate electrode and the active layer are formed as indicated by 405 and 406, respectively. The region 404 and the channel formation region do not overlap each other. That is, of the channel formation region, a region indicated by hatching 407 remains amorphous, thus greatly deteriorating the characteristics of the TFTs.

In this way, shrinkage of the substrate makes it quite difficult to perform a patterning step before processing at a high temperature is carried out. This high temperature varies, depending on the kind of the substrate. For Corning 7059 glass which is relatively often used, the high temperature is above 500° C.

SUMMARY OF THE INVENTION

In the present invention, thermal annealing is performed to a glass substrate at a first temperature not lower than the strain point of the glass substrate (strain temperature), preferably at a temperature not lower than a glass-transition temperature. The glass substrate is gradually cooled to e.g. a second temperature lower than the strain point at a speed of 2° C./min. or less, preferably at 0.5° C./min. or less, more preferably at 0.3° C./min. or less, thus the glass substrate itself is prevented from shrinking in a thermal treatment later. In general, the less the speed of temperature-decrease is, the better characteristics can be obtained. However, the less the speed of temperature-decrease is, the longer the process time is. Thus mass-productivity will fall down. Therefore, it is necessary to consider the process time and characteristics needed in selecting a speed of temperature-decrease. This thermal treatment may be employed in an oxidizing or nitriding atmosphere.

Thereafter an appropriate base film is formed on a substrate processed in this manner. Thereafter, an amorphous silicon film (non-single crystal silicon film) is formed and crystallized e.g. at a temperature not higher than the first temperature. As this base film, it is desirable to utilize a silicon oxide film, a silicon nitride film, an aluminum nitride film, or a multi-layer comprising two layers or more thereof.

The method as the following would be appropriate in performing above mentioned thermal annealing. FIG. 8 shows an example of a heating chamber utilized for the present invention, comprising a reaction tube 11 made of quartz, a means of holding a substrate (substrate holder) 12, a substrate 13 horizontally disposed. Though not shown in this figure, this apparatus has a heater to heat the reaction tube 11 from outside. In addition, this apparatus has a means of supplying a prescribed gas into the reaction tube, and a means of transporting the means of holding a substrate from the reaction tube to outside.

In FIG. 8, a glass substrate 13 is horizontally held on the substrate holder 12. It is effective here to hold the substrate horizontally to prevent the substrate from bending and from losing its flatness. A structure like this is advantageous in the case that a process of heating the glass substrate at a strain temperature or more is needed. The structure like this is appropriate for a later thermal annealing process on the silicon film, such as crystallization or activation.

Moreover, it is important to quench the substrate at 10° C./min. to 300° C./min. after the heating processes like film deposition, crystal growth, oxidation, and activation, which are to be performed after above mentioned heating process. Quenching the glass material at a temperature of ±100° C. of the strain point can prevent shrinkage of the glass material. For example, in the use of Corning 7059 glass as a glass material, further shrinkage (in some cases extension) can be effectively prevented as 30 ppm or lower by quenching the glass material in a process which needs process temperature from 493° C. to 693° C., at least until temperature of the glass material reaches 493° C.

In the case that a base film is formed on a substrate which has fully shrank, the base film absorbs the distortion caused by crystallization of the silicon film, thus helping the silicon film to be crystallized well.

It is feared that thermal annealing and gradual cooling on the substrate in the present invention may take time and that hinders productivity. As thermal annealing is performed without formation of objects related to a device.circuit on the substrate in the present invention, however, such thermal annealing process can be performed at a time in a glass factory. Therefore such thermal annealing will not degrade productivity of semiconductor circuits. Moreover, reliability of a device is improved because stress caused by shrinkage of the substrate and the like will not take effects to the objects constituting a semiconductor device including the base film.

Moreover, in the present invention, after a silicon oxide film, a silicon nitride film, an aluminum nitride film, or a multilayer comprising two or more layers thereof is formed as a base film on a glass substrate by a plasma CVD method, thermal annealing is performed to the substrate at a temperature not lower than the strain point (strain temperature) thereof, preferably at a temperature not lower than the glass-transition temperature. After that, the glass substrate is gradually cooled to a temperature not higher than the strain point at a speed of 2° C./min. or less, preferably 0.5° C./min. or less, more preferably 0.3° C./min or less. Thus shrinkage of the glass substrate itself caused by the following thermal process is prevented. The speed of temperature-decrease varies according to the type of the substrate. In general, the less the speed of temperature-decrease, the better characteristics can be obtained. However, the slower the speed of temperature-decrease, the longer the process time is. Thus mass-productivity will fall down. Therefore, it is necessary to consider the process time and characteristics needed in selecting a speed of temperature-decrease. This thermal treatment may be employed in an oxidizing or nitriding atmosphere. For example, if a nitriding gas such as nitrogen, ammonia, dinitrogen monoxide is utilized, a portion near the surface of the base film can be nitrogenized by this gas. Then boron, barium, sodium and the like which is an impurity in the glass can be prevented from precipitating into the semiconductor to be formed in the later process. This nitrogenization is effective in forming a semiconductor device with high reliability.

If a glass substrate is shrunk by heating, especially if it is gradually cooled after the heating process is finished, the glass substrate is greatly shrunk and moreover, partial stress in the glass substrate is relaxed. As a result, the more the glass substrate is shrunk, the smaller shrinkage of the substrate will be in the thermal process later. Furthermore, the higher this heating process temperature is, the bigger the effect will be. Therefore, even if thermal process is performed to the glass substrate again, it will not be shrunk or bent much further as the stress in the glass substrate has been alleviated. In addition, it has become clear that the glass substrate of the present invention, to which thermal annealing has been employed, will be hardly shrunk if it is suddenly cooled from the heating temperature.

The following is the case of utilizing Corning 7059 (strain point 593° C., glass-transition point 628° C.) as a substrate. The substrate to which thermal annealing has been employed at 640° C. for 4 hours and then has been gradually cooled at 0.2° C./min. to 550° C. shrinks as much as 1900 ppm. However, this substrate will hardly shrink thereafter. For example, even if the substrate is heated at 550° C. for 8 hours, it shrinks as low as 20 ppm. It shrinks as low as 70 ppm even if the substrate is heated at 600° C. for four hours. Thermal annealing at a temperature not higher than that of the first thermal annealing (640° C. here) does not cause shrinkage which is to be harmful for use of the substrate, but preferably, use of the substrate at a temperature not higher than the strain point is desirable. That is, in the case of utilizing Corning 7059 substrate, it is desirable thermal treatment (such as crystallization annealing)is performed to the substrate at a temperature not higher than 593° C. In addition, it is preferable the temperature of thermal annealing is ±30° C. of crystallization temperature of a silicon film.

A substrate to which no process has been performed shrinks as much as 1000 ppm or higher by thermal treatment at 550° C. for 8 hours. If a process of patterning exists before and after the thermal treatment, mask alignment becomes impossible. FIG. 10 shows shrinkage of the substrate according to the difference of cooling speed after thermal treatment at 600° C. for 4 hours. By cooling the substrate rapidly at a speed not less than the usual cooling, it becomes possible to suppress shrinkage to a practical one.

The method as the following would be appropriate in performing above mentioned thermal annealing. FIG. 8 shows an example of a heating chamber utilized for the present invention, comprising a reaction tube 11 made of quartz, a means of holding a substrate (substrate holder) 12, a substrate 13 horizontally disposed. Though not shown in this figure, this apparatus has a heater to heat the reaction tube 11 from outside. In addition, this apparatus has a means of supplying a prescribed gas into the reaction tube, and a means of transporting the means of holding a substrate from the reaction tube to outside.

In FIG. 8, a glass substrate 13 is horizontally held on the substrate holder 12. It is effective here to hold the substrate horizontally to prevent the substrate from bending and from losing its flatness. A structure like this is advantageous in the case that a process of heating the glass substrate at a strain temperature or more is needed. The structure like this is appropriate for a later thermal annealing process on the silicon film, such as crystallization or activation.

Moreover, it is important to quench the substrate at 10° C./min. to 300° C./min. after the heating processes like film deposition, crystal growth, oxidation, and activation, which are to be performed after above mentioned heating process. Quenching the glass material at a temperature of ±100° C. of the strain temperature can prevent shrinkage of the glass material. For example, in the use of Corning 7059 glass as a glass material, further shrinkage (in some cases extension) can be effectively prevented as 30 ppm or lower by quenching the glass material in a process which needs process temperature from 493° C. to 693° C., at least until temperature of the glass material reaches 493° C.

As above mentioned, if thermal annealing is performed to the glass substrate at a temperature not lower than the strain point, and then the glass substrate is gradually cooled, shrinkage and the like of the substrate hardly happens in the following thermal treatment process (crystallization thermal annealing and the like). Moreover, to form semiconductor circuits and the like with better yield and characteristics, it is preferable to form a base film before thermal annealing and gradual cooling of the substrate as above mentioned. For example, if a catalytic metal element (nickel and the like) is selectively introduced to a silicon film and horizontal growth is performed, then stress of the base film is relaxed by the cause of thermal annealing at a temperature not lower than the strain point, thus crystal growth is accelerated.

In the case of utilizing a silicon oxide film as a base film of the highest layer (that is, a silicon film is to be formed on it), the silicon oxide film gets to show characteristics similar to the thermal oxide film, thus characteristics can be improved. In general, a silicon film is formed closely adhering the base film. Here, many interface states are generated to the interface between this silicon film and the base film, particularly if the silicon film is formed by a plasma CVD method. This is because quality of the base film itself is not good. Thermal annealing at a high temperature is desirable for improving the film quality, but thermal annealing has not been usually performed at a temperature more than 600° C. Thus improvement of film quality has hardly seen. In the present invention, however, the substrate is annealed at a high temperature not lower than the distortion point of the substrate, and the quality of the film is improved. Characteristics of the semiconductor device is also improved. Etching rate of the film is also decreased. Decrease of etching rate of a film is essential to production of semiconductor devices with high yield.

Conventionally, what hinders improvement of yield of semiconductor devices such as TFT is the problem of overetching of the base film. Conventionally, a silicon film is patterned to separate each element to obtain a device such as TFT. A conventional method is shown in FIG. 5. A base film 52 is formed from a material such as silicon oxide on a substrate 51, and a silicon film 53 is deposited on it. A protection film 54 of a material such as silicon oxide or silicon nitride is formed by a physical vapor deposition method (PVD method, such as a sputter method) method or chemical vapor deposition method (CVD method, such as a plasma CVD method, photo-CVD method).

A film of a photo resist material is coated on the protection film 54 further, patterning is performed to the film by a known photolithography method, and photo resist 55 is selectively left. (FIG. 5(A)).

The protection film 54 is provided to prevent the silicon film and the photoresist film from directly contacting each other in this photolithography process. That is, the silicon film under the photoresist will be utilized as an active layer of TFT and the like which should be polluted very little. However, an insulating film formed by these PVD method or CVD method has many pinholes, and therefore must be several hundred Å or more thick.

A protection film 54 and a silicon film 53 are etched by dry etching or wet etching, and an island silicon film 56 is formed. A protection film 57 is closely adhered to the upper surface of this island silicon film. Wet etching is usually utilized for etching the protection film, and dry etching is usually utilized for etching the silicon film. Dry etching is utilized for etching the silicon film to prevent overetch as much as possible. (FIG. 5(B)).

By a known peeling method, the photoresist 55 is peeled off, and a condition shown in FIG. 5(C) is obtained. After that, a protection film 57 left in the island silicon film is etched. Here, the base film is simultaneously etched. Especially in the case of isotropic etching like wet etching, a hole 58 shown in FIG. 5(D) is formed. Degree x of this etching is decided by the difference of etching rates between that of the base film and the protection film, and the difference of thickness.

For example, if both the base film and the protection film are of the same etching rate, the base film is etched by a thickness at least that of the protection film. Because the base film is etched with some margin, degree of x becomes bigger than that of the protection film. It is necessary that etching rate of the protection film is bigger than that of the base film to make x smaller. However, in consideration of mass productivity, it is desirable to utilize silicon oxide formed by a plasma CVD method for both the protection film and the base film, and it is difficult to make etching rate of the base film smaller than that of the protection film.

Because the base film is overetched and a hole 58 is made, step coverage of the gate insulating film 59 and the gate electrode 60 to be formed on the base film is not good.

Thus isolation between the gate electrode and the active layer is not enough, and leak current occurs. In the case of a gate electrode patterned in stripe, a hole 58 is left unburied even if the gate insulating film is deposited and etchant intrudes and etches the gate electrode from underside. It causes the gate electrode to be disconnected. In the case of TFT which performs anodic oxidation to the gate electrode (e.g. Laid-open 5-152335), anodic oxidation proceeds not only from the upper surface of the gate electrode but also from underside, thus causing the gate electrode to be disconnected.

In thermal annealing process on the substrate of the present invention, the problem of etching rate is solved. For example, with regard to a silicon oxide film to be deposited by a plasma CVD method with utilizing TEOS (tetra ethoxy silane, $Si(OC_2H_5)_4$) as a material gas, etching rate is about 930 Å/min. even if annealing is performed at 550° to 600° C. for four hours. However, if annealing is performed at 640° C. for four hours, it is improved as 820 Å/min. This value is bigger than that of a thermal oxide film or a silicon oxide film formed by a sputter method by merely 10%. Thus overetching is prevented and the defects above mentioned caused by overetching is also improved. Furthermore, mass productivity is improved because a silicon oxide film by a plasma CVD method can be utilized as a base film. Especially in the case thermal treatment in an atmosphere such as oxygen, nitrogen oxide, ozone and the like is employed to the base film, carbon and hydrogen in the silicon oxide film can be removed, and dangling bonds of silicon can be buried by oxygen. Thus film quality can be further improved.

Because the glass substrate to which thermal treatment has been performed will not shrink by thermal treatment later at a lower temperature, it is very convenient for forming a semiconductor device.circuit. In addition, by forming a base film before the thermal annealing and gradual cooling process above mentioned, characteristics of the base film is improved, and characteristics and yield of the semiconductor device can be improved.

When a crystallization method which needs selective addition of catalytic metal element is adopted, patterning processes exist interposing a thermal annealing process at 500° to 600° C. (crystallization process), and shrinkage of the substrate is a big problem. However, in the present invention, patterning can be performed stably, and a device can be formed with high yield.

In the present invention, use of a silicon oxide film formed by a plasma CVD method as a base film is greatly beneficial for mass production. Conventionally, in consideration of characteristics of the base film and etching rate, silicon oxide formed by a sputtering method was the most appropriate, but what was problematic was low productivity (throughput). The present invention enables a silicon oxide film to be utilized as a base film even if it is made by a plasma CVD method, which is comparable to that made by a sputter method.

The present invention is characterized in that a glass substrate is approximately horizontally held and heated, to prevent the substrate from being bent during thermal treatment thereof. An example of an apparatus in which the glass substrate is approximately horizontally held is shown in FIG. 8.

FIG. 8 shows an example of a heating chamber utilized for the present invention, comprising a reaction tube 11 made of quartz, a means of holding a substrate (substrate holder) 12, a substrate 13 horizontally disposed. Though not shown in this figure, this apparatus has a heater to heat the reaction tube 11 from outside. In addition, this apparatus has a means of supplying a prescribed gas into the reaction tube, and a means of transporting the means of holding a substrate from the reaction tube to outside.

In FIG. 8, a glass substrate 13 is horizontally held to the substrate holder 12. It is effective here to hold the substrate horizontally to prevent the substrate from bending and from losing its flatness. A method like FIG. 8 is advantageous in the case that a process of heating the glass substrate at a strain temperature or more is needed.

If it is not wanted to have the glass substrate shrink during the thermal process, there is a method to heat the glass substrate beforehand (preheat) to have it shrink, thus decreasing shrinkage of the glass substrate in the later thermal process.

As a thermal process to be performed after preheat, there is a process of heating the glass substrate, for example, crystallization by heating amorphous semiconductor (non-single crystal semiconductor) formed on said glass substrate, thermal annealing to a semiconductor film or a semiconductor device formed on said glass substrate, a thermal process needed in forming a semiconductor film or an insulating film on said glass substrate.

There is a known technology that an amorphous silicon film is formed on a glass substrate directly or via a buffer such as silicon oxide and is heated at approximately 600° C. for crystallization. It has been known by the study of the present inventors that an amorphous silicon film can be crystallized even at not higher than 600° C. by introducing impurities such as Ni, Pb, or Si as a catalytic element into the amorphous silicon film to promote crystallization of the silicon film. It has been also known that crystal growth in the parallel direction with the substrate, and selective crystal growth is obtained by selectively introducing these impurities such as Ni, Pb, or Si for enhancing crystallization. The silicon film is crystallized from a location of the catalytic element introduced.

If such a process as this is to be adopted, a process of mask-alignment is needed to selectively introducing the impurities before crystallization by heating. Therefore, in this case, the present invention can be effectively utilized to suppress shrinkage of the glass substrate (some glass has anisotropy in extension or shrinkage) at the minimum (at least not more than 30 ppm) in the following heating processes.

The present invention is also useful in forming an oxide film on the surface of semiconductor by heating in an oxide atmosphere (generally called as thermal oxidation). This invention is also useful in forming a prescribed film by heating in an atmosphere including a material of this film.

A method of fabricating a semiconductor device on a glass substrate in accordance with an aspect of the present invention comprises the steps of:

heat-treating said glass substrate at a temperature higher than a process temperature used later while holding said substrate substantially horizontal prior to formation of said semiconductor device; and cooling said glass substrate at a rate of 0.01° to 0.5° C./min in an ambient of nitrogen, ammonia, or dinitrogen monoxide while holding said substrate substantially horizontal.

Other objects and features of the invention will appear in the course of the description thereof, which follows.

BRIEF DESCRIPTION OF THE DRAWINGS

FIG. 10 shows data of shrinkage of glass substrates;

DETAILED DESCRIPTION OF THE INVENTION

EXAMPLE 1

The present example is an example of a complementary combination of a P-channel TFT (PTFT) and an N-channel TFT (NTFT). These TFTs use a crystalline silicon film formed on a glass substrate. The configuration of the present example can be used for switching devices for pixel electrodes for an active-matrix liquid crystal display, a peripheral driver circuit, an image sensor, and an integrated circuit.

FIGS. 1(A)–1(E) are a cross-sectional view of TFTs, illustrating the process sequence of the present example. The present example includes patterning steps and a main heat treatment step (excluding thermal annealing and slow cooling of the substrate) which are carried out in the manner described below.

Figure 1A:
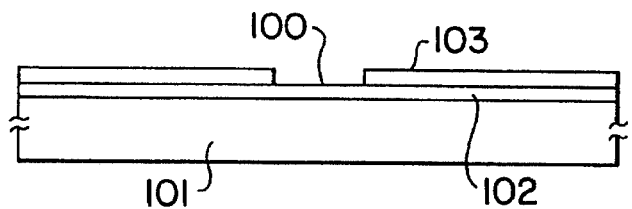
FIGS. 1(A)–1(E) are a cross-sectional view of TFTs of Example 1 of the present invention, illustrating successive steps for fabricating the TFTs.
Figure 1B:
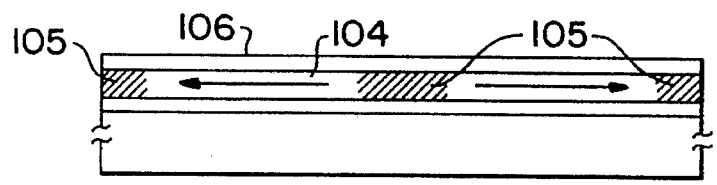
Figure 1C:
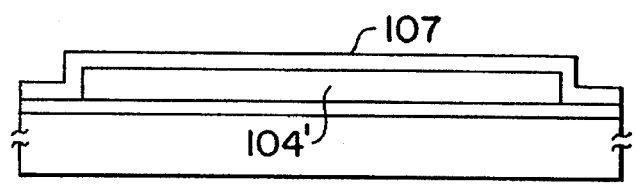

(1) patterning of a nickel doping mask (FIG. 1(A))

(2) annealing (at 550° C. or at 600° C. (FIG. 1(B)) for crystallization (3) patterning of an active layer (FIG. 1(C))

Figure 1D:
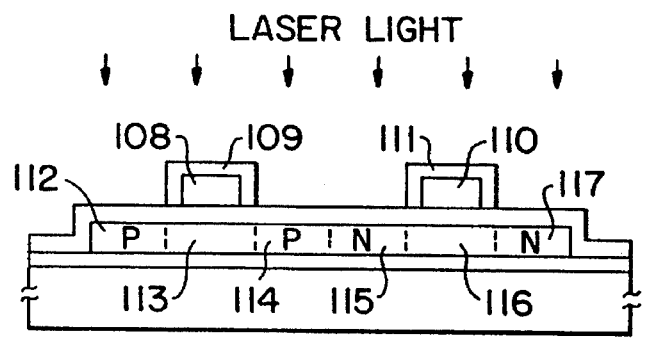
Figure 1E:
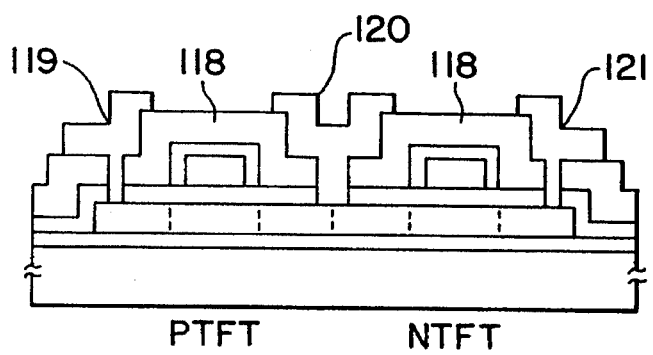
Figure 2A:
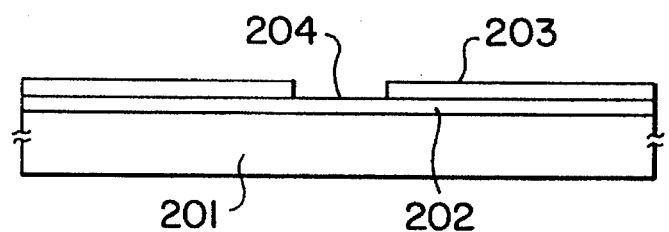
FIGS. 2(A)–2(E) are a cross-sectional view of TFTs of Example 2 of the invention, illustrating successive steps for fabricating the TFTs.
Figure 2B:
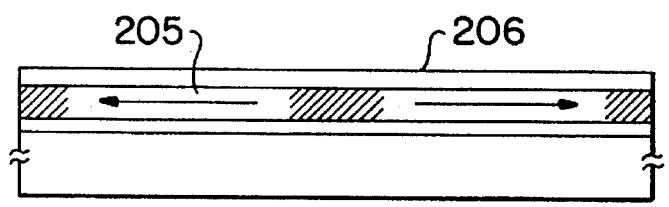
Figure 2C:
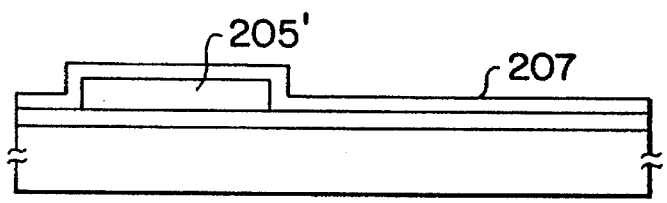
Figure 2D:
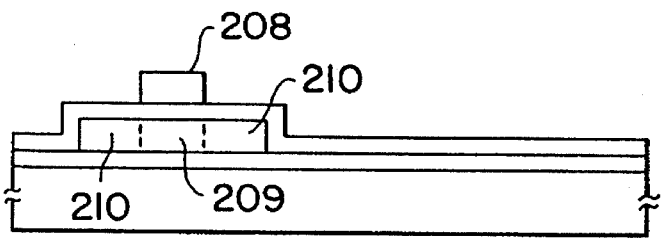
Figure 2E:
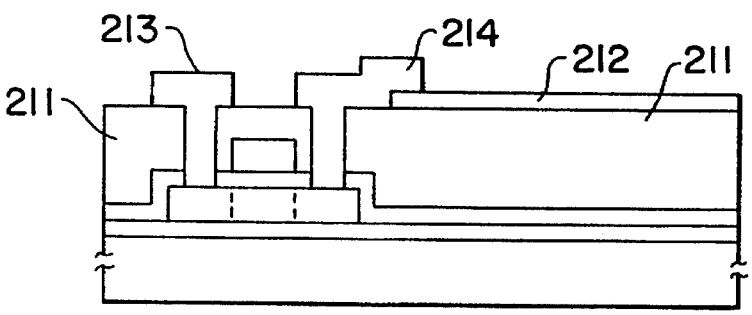
Figure 3A:
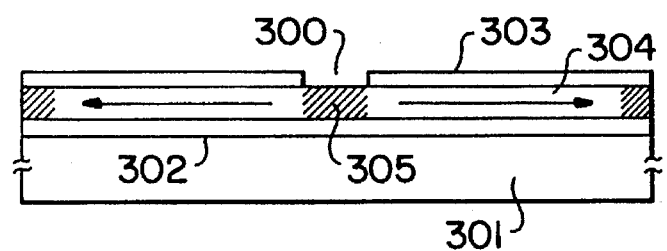
FIGS. 3(A)–3(E) are a cross-sectional view of TFTs of Example 3 of the invention, illustrating successive steps for fabricating the TFTs.
Figure 3B:
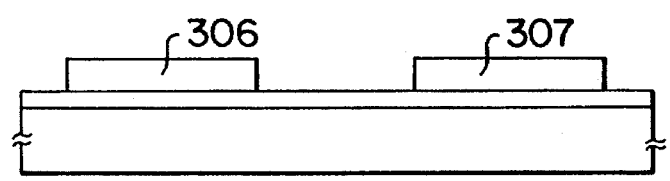
Figure 3C:
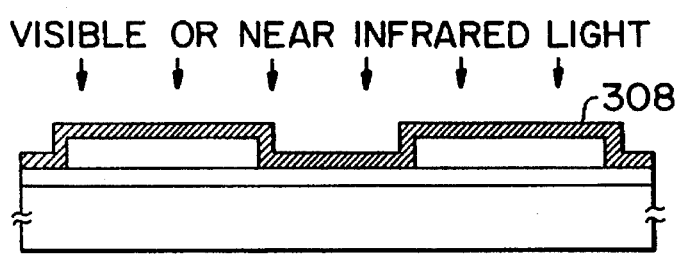
Figure 3D:
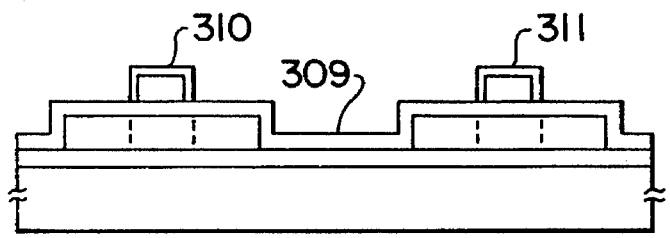
Figure 3E:
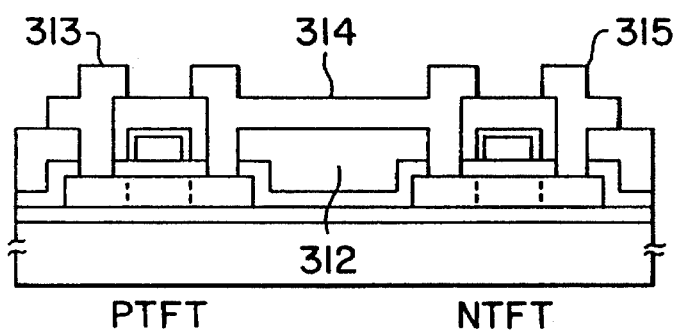
Figure 4A:
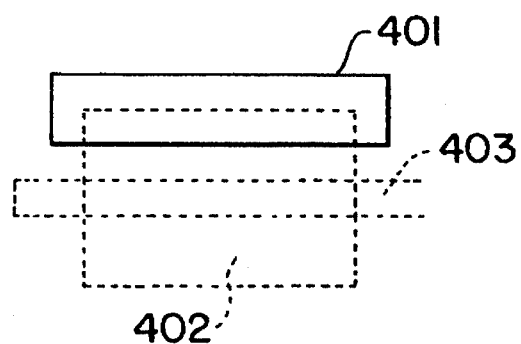
FIGS. 4(A)–4(C) are a diagram illustrating an example of deviation of patterning caused by shrinkage of a substrate in the prior art techniques.
Figure 4B:
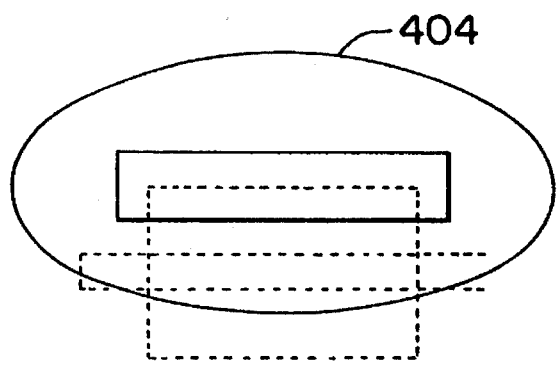
Figure 4C:
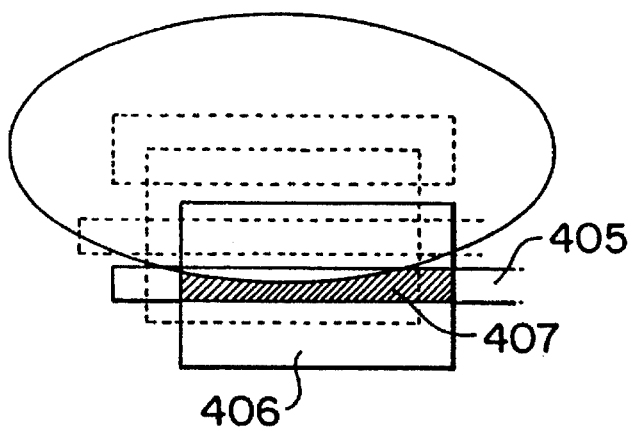
Figure 5A:
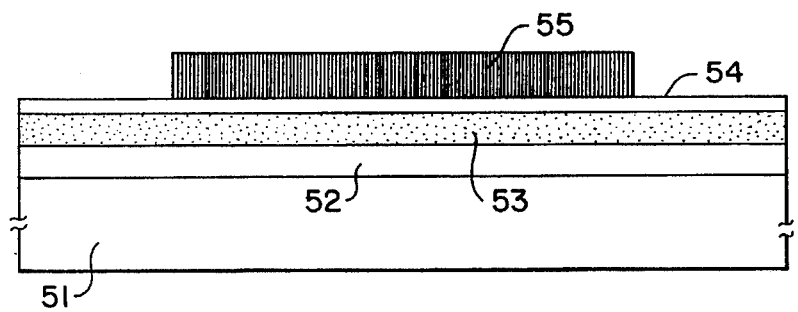
FIGS. 5(A)–5(E) are a cross-sectional view of TFTs, illustrating overetching of the bottom film during the fabrication of the TFTs by the prior art techniques.
Figure 5B:
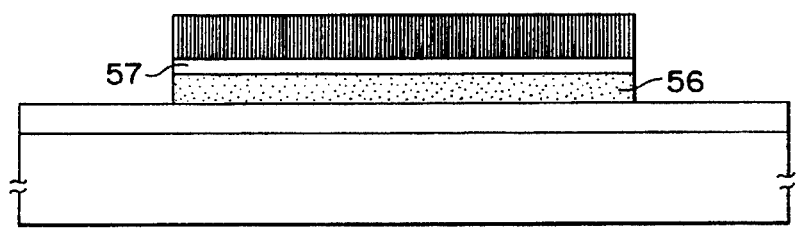
Figure 5C:
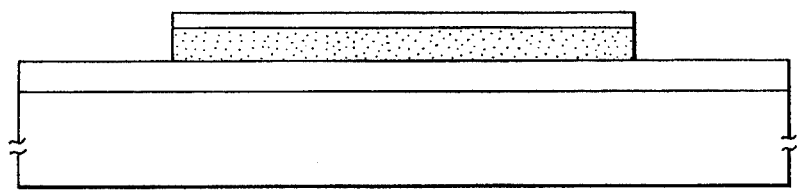
Figure 5D:
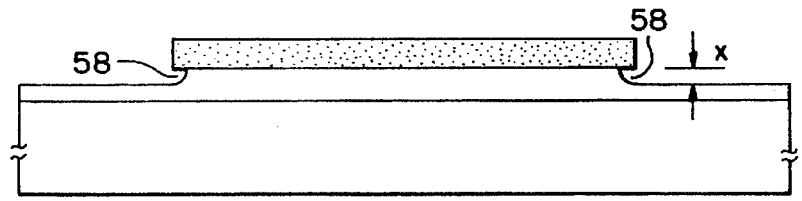
Figure 5E:
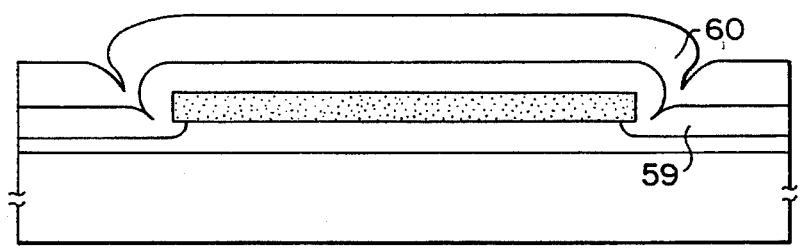

(4) patterning of a gate electrode (5) patterning of contact holes (6) patterning of source/drain electrodes and their interconnects (FIG. 1(D)).

Of these steps, patterning steps are carried out before and after the thermal annealing step (2) and so the substrate is required not to shrink in spite of these thermal annealing steps.

First, a substrate 101 made of Corning 7059 glass was cleaned. A bottom film 102 made of silicon oxide and having a thickness of 2000 Å was fabricated out of TEOS and oxygen by plasma-assisted CVD (PCVD). Then, the substrate 101 was annealed at a temperature (600°–660° C., e.g., 640° C.) higher than the strain point (593° C.) for 1–4 hours, e.g., 4 hours using a thermal annealing furnace shown in FIG. 8. Subsequently, the laminate was slowly cooled at a rate of 0.1°–0.5° C./min, e.g., 0.2° C./min. When the temperature dropped to 450°–590° C., e.g., 550° C., the laminate was taken out. The cooling rate is controlled by varying an introducing amount of the atmosphere gas. Preferably, this temperature is lower than the highest temperature in a later heat treatment step. In particular, in the present invention, annealing temperature for crystallization is the highest temperature in the later processing. Therefore, if the annealing temperature for crystallization is 600° C., then it is desired to withdraw the laminate at a temperature under 600° C. The above-described thermal annealing was carried out within oxygen flow. It is preferred that this thermal annealing is carried out by holding the substrate within ±30 degrees from horizontal in order to prevent the substrate from warping.

A mask 103 was formed out of a photoresist or etchable polyimide or photosensitive polyimide (such as Photoneece manufactured by Toray Industries, Inc., Japan) on the substrate which was processed as described above. The mask was then patterned to form a region 100 which selectively exposed the bottom film (FIG. 1(A)).

A nickel film having an average thickness of 5 to 20 Å, e.g., 10 Å, was formed by sputtering. Strictly speaking, since this film was so thin that it did not assume the form of a film. At this time, it was desired to heat the substrate to 150°–300° C. Therefore, the mask 103 preferably has sufficient heat-proofness. Then, the mask 103 was removed. Thereafter, an intrinsic (I-type) amorphous silicon film (an intrinsic non-single crystal silicon film) 104 having a thickness of 300 to 1500 Å, e.g., 800 Å, was formed by PCVD. Also, a protective film 106 having a thickness of 200 Å was formed by PCVD.

The laminate was thermally annealed at 550° C. for 8 hours or at 600° C. for 4 hours in an inert nitrogen ambient in atmospheric pressure to crystallize the amorphous film (non-single crystal film). At this time, in the region 100 in which a nickel film was selectively formed, crystallization of the crystalline silicon film 104 progressed perpendicularly to the substrate 101. In regions other than the region 100, crystal growth progressed laterally, i.e., parallel to the substrate, from the region 100 as indicated by the arrows. A region 105 containing the surroundings of the region 100 in which the nickel film was directly formed and the front ends of the growing crystals was heavily doped with nickel (FIG. 1(B)).

After this step, the silicon film was patterned to form active layer 104' of TFTs in the form of islands. At this time, it was important that the front ends of the growing crystals did not exist in a portion becoming the channel formation region. The front ends are at the interface between the crystalline silicon region and the amorphous silicon region and heavily doped with nickel. In this way, in the channel formation region, carriers moving between source and drain are not affected by nickel element. In this step, the crystals grew 100 μm at best, i.e., from the nickel-doped region 100 to the front ends of the growing crystals.

In the past, an annealing step for crystallization was carried out between the step of patterning the nickel-introducing mask 103 and the step of patterning the active layer 104'. Therefore, the substrate shrank as much as 1000 ppm. That is, for a substrate 100 mm square, it shrank as much as 50 μm vertically. This made it impossible to perform an accurate patterning step. On the other hand, in the present example, shrinkage of the substrate was suppressed below 70 ppm. That is, the substrate 100 mm square shrinks only less than 4 μm vertically. This assures implementation of an accurate patterning step.

The dimension of the active layer 104' is determined, taking account of the channel length and the channel width of TFTs. Smaller active layers measured 50 μm by 20 μm. Larger active layers measured 100 μm by 1000 μm. Numerous active layers of this kind were formed on a substrate. A silicon oxide film 107 having a thickness of 1200 Å was fabricated out of TEOS and oxygen by PCVD. In this way, a gate-insulating film was formed (FIG. 1(C)).

Subsequently, an aluminum film containing 0.01 to 0.2% scandium and having a thickness of 6000 to 8000 Å, e.g., 6000 Å, was formed by sputtering. This aluminum film was patterned to form gate electrodes 108 and 110. The surfaces of this aluminum electrodes were anodized to form oxide layers 109 and 111 on the surfaces. This anodic oxidation was carried out in an ethylene glycol solution containing 1 to 5% tartaric acid. The thickness of the obtained oxide layers 109 and 111 was 2000 Å. Since these oxide layers 109 and 111 determine the thickness of an offset gate region in a later ion doping step, the length of the offset gate region can be determined in the above-described anodization step.

Then, using a gate electrode portion (comprising the gate electrode 108, the surrounding oxide layer 109, the gate electrode 110, and the surrounding oxide layer 111) as a mask, an impurity was implanted into the active region (becoming the source/drain and the channel) to impart conductivity type P or N by self-aligning techniques and by ion doping (also known as plasma doping). Phosphine ($PH_3$) and diborane ($B_2H_6$) were used as dopant gases. Where the phosphine was used, the accelerating voltage was 60 to 90 kV, e.g., 80 kV. Where the diborane was used, the accelerating voltage was 40 to 80 kV, e.g., 65 kV. The dose was $1\times10^{15}$ to $8\times10^{15}$/cm$^2$. For example, phosphorus was implanted at a dose of $2\times10^{15}$/cm$^2$. Boron was implanted at a dose of $5\times10^{15}$/cm$^2$. During the implantation, one region was coated with a photoresist to selectively implant the elements. As a result, N-type doped region 115, 117 and P-type doped regions 112, 114 were formed. In this way, a region for a P-channel TFT (PTFT) and a region for an N-channel TFT (NTFT) could be formed.

Thereafter, the laminate was annealed by irradiation of laser light. The laser light was emitted by a KrF excimer laser having a wavelength of 248 nm and a pulse width of 20 nsec. Other lasers can also be used. The laser light was emitted at an energy density of 200 to 400 mJ/cm$^2$, e.g, 250 mJ/cm$^2$. Two to 10 shots of laser light were emitted per location. For example, two shots were emitted. During illumination of this laser light, if the substrate is heated to about 200° to 450° C., then the effect can be enhanced (FIG. 1(D))..

Subsequently, a silicon oxide film 118 having a thickness of 6000 Å was formed as an interlayer insulator by PCVD. This interlayer insulator may also be made of either polyimide or a two-layer film consisting of silicon oxide and polyimide. Then, contact holes were formed. Electrodes and interconnects 119, 120, and 121 of TFTs were fabricated out of a metal material such as a multilayer film of titanium nitride and aluminum. Finally, the laminate was annealed at 350° C. for 30 minutes in a hydrogen ambient at 1 atm to complete a semiconductor circuit having complementary TFTs (FIG. 1(E)).

The circuit described above is of the CMOS structure comprising complementary PTFT and NTFT. In the above step, it is also possible to fabricate the two TFTs simultaneously. Then, the substrate is cut at the center to obtain two independent TFTs at the same time.

In the present example, the method of introducing nickel consists of selectively forming a nickel as a thin film on the bottom film 102 under the amorphous silicon film (non-single crystal silicon film) 104, and crystals are grown from this portion.

Since the thin film is so thin that it is difficult to observe it as a film. Alternatively, a nickel film can be selectively formed after formation of the amorphous silicon film (non-single crystal silicon film) 104. That is, the crystal growth may be started either from the top surface of the amorphous silicon film (non-single crystal silicon film) or from the bottom surface. In a further method, an amorphous silicon film (non-single crystal silicon film) is previously formed, and nickel ions are selectively implanted into the amorphous silicon film (non-single crystal silicon film) 104 by ion doping. In this case, the concentration of the nickel can be controlled accurately. Plasma processing and CVD may also be employed.

EXAMPLE 2

The present example is an active-matrix liquid crystal display comprising N-channel TFTs which are formed at pixels as switching devices. In the description made below, only one pixel is described but many other (generally hundreds of thousands of) pixels are formed similarly. Obviously, the TFTs are not limited to N-channel TFTs. P-channel TFTs can also be used. The TFTs can be used in a peripheral circuit as well as in pixels of a liquid crystal display. Furthermore, they can be used in an image sensor and other apparatus. That is, if they are used as thin-film transistors, no restriction is imposed on their application.

The process sequence of the present example is schematically shown in FIGS. 2(A)–2(E). In the present example, an OA-2 substrate manufactured by Nippon Electric Glass Manufacturing Co., Ltd., Japan, was used as a substrate 201. This substrate had a strain point of 635° C., a thickness of 1.1 mm, and measured 300 mm by 400 mm. First, a bottom film 202 of silicon oxide was formed on the substrate 201 to a thickness of 2000 Å by PCVD. In this PCVD, TEOS and oxygen were used as raw material gases. This laminate was annealed for 2 hours at 700° C. which was higher than the strain point of the substrate. Then, the laminate was slowly cooled down to 600° C. at a rate 0.2° C./min. The thermal annealing and the slow cooling were conducted within oxygen stream. The thermal processing described thus far greatly reduced shrinkage of the substrate. For example, where the substrate was annealed at 600° C. for 4 hours, shrinkage of only 20 ppm was observed. Where the substrate was annealed at 550° C. for 4 hours, shrinkage of only 10 ppm was observed.

Subsequently, in order to selectively introduce nickel, a mask 203 was formed out of polyimide. A nickel film having a thickness of 5 to 200 Å, e.g., 20 Å, was formed by sputtering. In this way, a nickel film was selectively formed in a region 204 (FIG. 2(A)).

Thereafter, an amorphous silicon film (non-single crystal silicon film) 205 having a thickness of 1000 Å was formed by LPCVD or PCVD. Also, a silicon oxide film 206 having a thickness of 200 Å was formed as a protective film by PCVD. The laminate was then dehydrogenated at 450° C. for 1 hour, followed by thermal annealing to crystallize the amorphous film (non-single crystal silicon film). This thermal annealing was carried out at 600° C. for 4 hours in a nitrogen ambient. In this annealing step, since a nickel film was formed in the region 204 under the amorphous silicon film 205, crystallization started from this portion. At this time, in the region 204 where the nickel film was formed, silicon crystals grew vertically to the substrate 201. In regions (regions other than the region 204) in which the nickel film was not formed, crystal grew parallel to the substrate as indicated by the arrows (FIG. 2(B)).

After the thermal annealing step, the crystallized silicon film was photolithographically patterned to leave behind only an active layer 205' of a TFT in the form of an island. The other portions were removed. At this time, it is important that the front ends of the growing crystals do not exist in the active region, especially in the channel formation region. More specifically, it is desired that of the silicon film 205 shown in FIG. 2(B), at least the front ends of the growing crystals and the nickel-doped region 204 be etched away, and that intermediate crystal portions of the crystalline silicon film 205 grown parallel to the substrate be used as the active layer. Since nickel is concentrated at the front ends of the growing crystals and at the nickel-doped regions, removal of these portions prevents the high concentration of nickel from adversely affecting the characteristics of the TFT.

Then, a gate-insulating film 207 of silicon oxide having a thickness of 70 to 120 nm, typically 120 nm, was formed out of TEOS by PCVD in an oxygen ambient. The substrate temperature was 350° C. (FIG. 2(C)).

Thereafter, a film consisting mainly of well-known polysilicon was formed by CVD and photolithographically patterned to form a gate electrode 208. In order to improve the conductivity, 0.1 to 5% phosphorus was added as a dopant.

Then, phosphorus was implanted as an N-type dopant by ion doping, and source/drain regions 210 and a channel formation region 209 were formed by self-aligning techniques. The laminate was annealed at 550° C. for 4 hours to improve the crystallinity of the silicon film which were deteriorated by the ion implantation. Since nickel acting to promote crystallization was contained originally, it was easy to crystallize the active layer. As a result of this thermal annealing, the sheet resistance of the source/drain regions of the TFT assumed a value of 300 to 800 Ω/cm$^2$ (FIG. 2(D)).

Thereafter, an interlayer insulator 211 was formed out of silicon oxide or polyimide. Then, a pixel electrode 212 was formed out of ITO. Contact holes were formed. Electrodes 213 and 214 were formed out of a multilayer film of chromium and aluminum in the source/drain regions of the TFT. One electrode 214 was connected also with the ITO pixel electrode 212. Finally, the laminate was annealed at 200°–400° C. for 2 hours within hydrogen to carry out hydrogenation. In this way, one TFT was completed. This step was effected at the same time in numerous other pixel regions. In order to improve the resistance to moisture, a passivation film made of silicon nitride or the like may be formed over the whole surface (FIG. 2(E)).

In the TFTs fabricated in the present example, the active layer forming the source regions, the channel formation regions, and the drain regions is made of a crystalline silicon film grown in the direction in which carriers flow and so the carriers do not cross crystal grain boundaries. That is, the carriers move along the grain boundaries of crystal whiskers taking a filamentary form. Therefore, TFTs having a high carrier mobility can be fabricated. The TFTs fabricated in the present example was of the N-channel type. The mobility was 90 to 130 $cm^2/V.s$, which is a great improvement over the mobility of 50 to 70 $cm^2/V.s$ of prior art N-channel TFTs using a crystalline silicon film formed by crystallization caused by a thermal anneal conducted at 600° C. for 48 hours.

In the present example, thermal annealing is utilized to activate the implanted dopant. This causes a milder reaction than the reaction induced by irradiation of laser radiation as in the case of Example 1. Especially, where laser annealing was used, discontinuity of crystallinity at the interface between the shadow portion of the gate electrode and the irradiated portion resulted in a decrease in the reliability. In the present example, the channel formation region and the source/drain regions are heated uniformly. In consequence, the manufactured TFTs have especially excellent reliability.

EXAMPLE 3

The present example is described by referring to FIGS. 3(A)–3(E). Corning 1733 glass having a strain point of 640° C. was used as a substrate 301. A bottom film 302 was formed on the glass substrate 301 by PCVD. The laminate was annealed at 700° C., i.e., above the strain point, for 1 hour in a dinitrogen monoxide ($N_2O$) ambient. Then, the laminate was slowly cooled down to 600° C. at a rate of 0.2° C./min. An amorphous silicon film (non-single crystal silicon film) 304 having a thickness of 300 to 800 Å was formed by PCVD. Then, using a 1000 Å-thick-mask 303 of silicon oxide, a nickel film was formed in a region 300 in the same way as in Example 1. The laminate was thermally annealed at 550° C. for 8 hours to crystallize the silicon film 304. At this time, crystals grew parallel to the substrate as indicated by the arrows 304 (FIG. 3(A)).

Then, the mask 303 acting as a protective film during annealing for crystallization was removed. The silicon film 304 was photolithographically patterned to form active layer regions 306 and 307 in the form of islands. Nickel was directly introduced in the region 300 (FIG. 3(A)). This region 300 was heavily doped with nickel. As described already in Examples 1 and 2, nickel existed also at a high concentration at the end points of the growing crystals. We have found that the concentration of nickel in these regions is higher than the concentration of nickel in the intervening crystallized region by almost one order of magnitude. Therefore, in the present invention, the patterning step was so carried out that the heavily doped regions were removed to leave the active layer regions 306 and 307 for forming active devices such as TFTs. The active layer was etched by an RIE method having vertical anisotropy (FIG. 3(B)).

In the present example, a complementary TFT circuit is built, utilizing the active layers 306 and 307. That is, the circuit according to the present invention differs from the configuration of Example 1 shown in FIG. 1(D) in that PTFT and NTFT are separated from each other. More specifically, in the structure shown in FIG. 1(D), the active layers of two TFTs are continuous. The concentration of nickel in the intervening region is high. The present example is characterized in that the concentration of nickel is low everywhere. This can enhance the stability of operation.

Then, a silicon oxide film or silicon nitride film 308 having a thickness of 200 to 3000 Å was formed by PCVD. Subsequently, lamp annealing using infrared light or near-infrared light was carried out. A halogen lamp was used as an infrared light source. The used wavelength was 0.5 to 4 μm, preferably 0.8 to 1.3 μm, which was well absorbed by crystalline silicon. The intensity of the visible light or near-infrared light was so adjusted that the temperature on the single-crystal silicon monitor wafer was between 800° and 1300° C., typically between 900° and 1200° C. More specifically, the temperature of a thermocouple buried in the silicon wafer was monitored. The resulting signal was fed back to the infrared light source. The infrared light irradiation was effected in a $H_2$ ambient, which may contain 0.1 to 10% HCl, other halogenated hydrogen, a fluorine compound, a chlorine compound, or bromine compound.

In the present example, the protective film of silicon oxide or silicon nitride was formed on top of the active layer during irradiation of visible light or near-infrared light. This could prevent the surface from roughening or becoming contaminated during irradiation of infrared radiation. The crystallinity which cannot be enhanced sufficiently only with crystallization owing to thermal annealing could be improved sufficiently by using such a lamp annealing step at the same time (FIG. 3(C)).

After irradiation of the visible light or near-infrared light, the protective film 308 was removed. Thereafter, a gate-insulating film 309 and gate electrodes 310, 311 were formed in the same way as in Example 1. The gate electrodes were made from tantalum. A coating of tantalum oxide was formed on the surface of the gate electrodes to a thickness of 1000 to 3000 Å, e.g., 3000 Å, by anodic oxidation. Then, an impurity element was implanted in the same way as in Example 1, and source/drain regions were formed.

Lamp annealing was used to activate this impurity. A halogen lamp was used as the light source of the infrared light. Visible light or infrared light having wavelengths of 0.5 to 4 μm, preferably 0.8 to 1.3 μm, was irradiated for 30 to 180 seconds. Visible and infrared light lying in this wavelength range can be easily absorbed by amorphous silicon doped with phosphorus or boron at a concentration of $10^{19}$ to $10^{21}$ $cm^{-3}$. An effective anneal comparable to a thermal anneal conducted above 1000° C. can be carried out. On the other hand, this radiation is not readily absorbed by glass substrate and so it is not overheated. Also, the processing can be completed in a short time. Therefore, it can be said that this is the best method for a step where shrinkage of a glass substrate is a problem. This method is more appropriate in the present example because the substrate has been previously processed to prevent its shrinkage.

The intensity of the visible light or near-infrared light was so adjusted that the temperature on the single crystal silicon monitor wafer was between 800° and 1300° C., typically between 900° and 1200° C. More specifically, the temperature of a thermocouple buried in the silicon wafer was monitored. The resulting signal was fed back to the infrared light source. The infrared light irradiation was effected in a H$_2$ ambient, which may contain 0.1 to 10% HCl, other halogenated hydrogen, a fluorine compound, a chlorine compound, or bromine compound (FIG. 3(D)).

Thereafter, an interlayer insulator 312 was formed, and contact holes were formed in the insulator. Metallic interconnects 313, 314, and 315 were formed. Finally, the laminate was annealed at 250°–400° C., e.g., 350° C., at 1 atm within a hydrogen ambient to carry out hydrogenation (FIG. 3(E)).

In this way, a complementary TFT circuit was completed. In the present example, during the lamp anneal, i.e., during irradiation of visible light or near-infrared light, the protective film was formed on the surface of the active layer and so the surface is prevented from roughening or becoming contaminated. Consequently, TFTs fabricated in the present example had excellent characteristics including excellent field mobility and threshold voltage and quite high reliability.

EXAMPLE 4

The present example is a complementary circuit of a P-channel TFT (PTFT) and an N-channel TFT (NTFT). These TFTs use crystalline silicon formed on a glass substrate as shown in FIGS. 6(A)–6(E). The configuration of the present example can be applied to switching devices for pixel electrodes of an active-matrix liquid crystal display, to its peripheral driver circuit, and also to an image sensor and an integrated circuit.

Figure 6A:
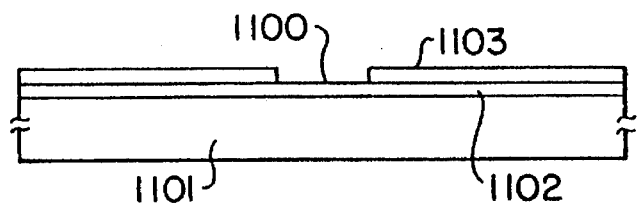
FIGS. 6(A)–6(E) are a cross-sectional view of TFTs of Example 4 of the invention, illustrating successive steps for fabricating the TFTs.
Figure 6B:
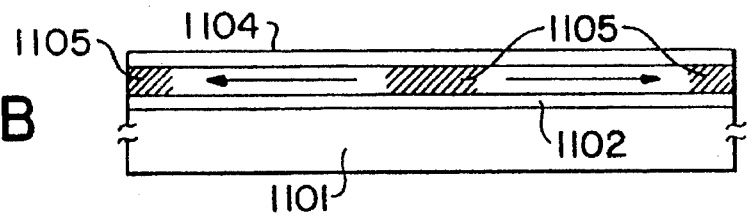

FIGS. 6(A)–6(E) are a cross-sectional view, illustrating the process sequence of the present example. Patterning steps and main heat treatment steps (excluding thermal annealing and slow cooling of the substrate) in the present example are summarized as follows:

(1) Patterning of a nickel doping mask (FIG. 6(A))

(2) Anneal for crystallization (at 550°–600° C.) (FIG. 6(B))

Figure 6C:
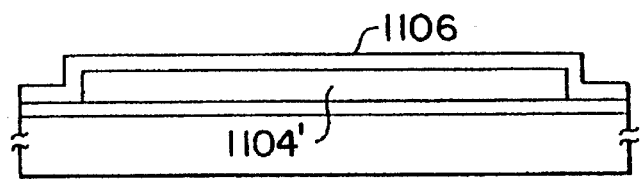

(3) Patterning of an active layer (FIG. 6(C))

Figure 6D:
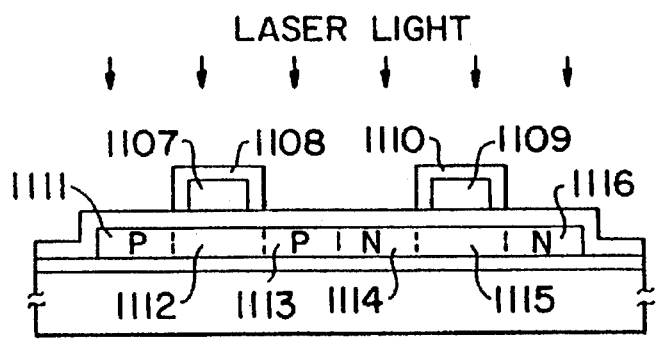
Figure 6E:
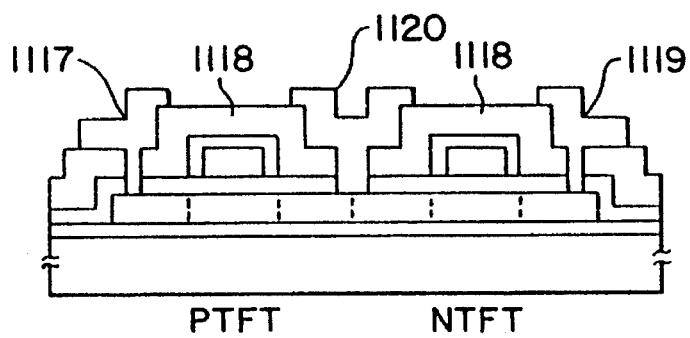
Figure 7A:
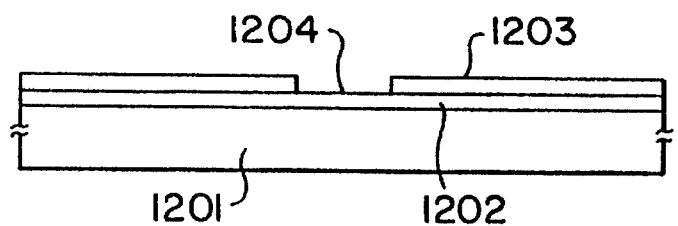
FIGS. 7(A)–7(E) are a cross-sectional view of TFTs of Example 5 of the invention, illustrating successive steps for fabricating the TFTs.
Figure 7B:
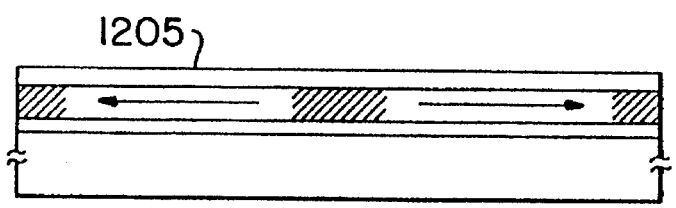
Figure 7C:
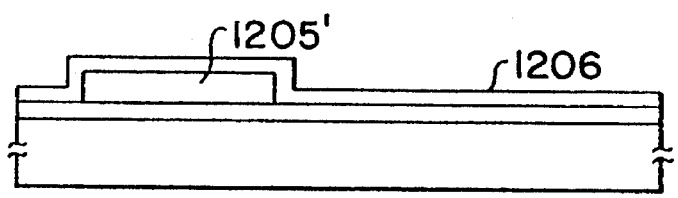
Figure 7D:
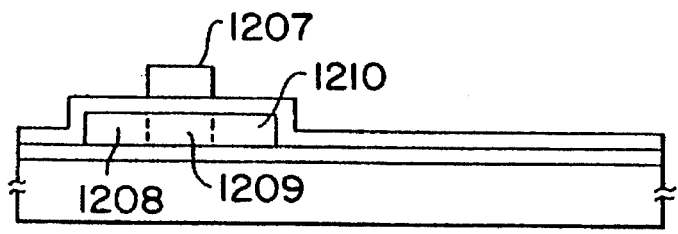
Figure 7E:
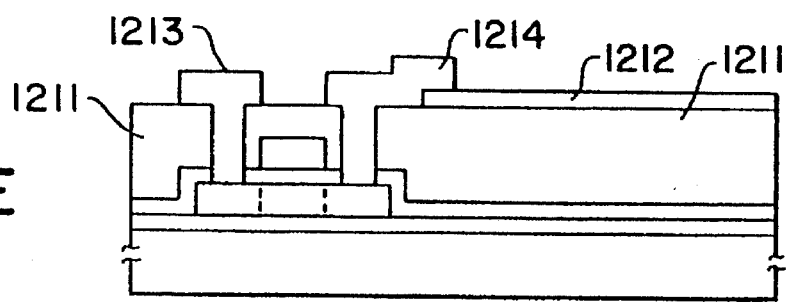

(4) Patterning of gate electrodes (5) Patterning of contact holes (6) Patterning of source/drain electrodes and their interconnects (FIG. 6(D)).

Since the two patterning steps are carried out before and after the thermal annealing step (2), the substrate is required not to shrink during this annealing step.

First, a substrate made of Corning 7059 glass was annealed at 600°–660° C., e.g., 640° C., above the strain point of 593° C. of the glass for 1 to 4 hours, e.g., 1hour. Then, the laminate was slowly cooled at a rate of 0.1 to 0.5° C./min, e.g., 0.2° C./min. When the temperature dropped to 450°–590° C., e.g., 550° C., the substrate was withdrawn. This withdrawing temperature is preferably lower than the maximum temperature in later thermal processing steps. That is, in the present example, the annealing temperature for crystallization is the maximum temperature in the later steps. Therefore, if the annealing temperature for crystallization is 600° C., then it is desired to withdraw the substrate at a temperature below 600° C. The above thermal annealing process was carried out in an oxygen flow. This thermal annealing is preferably carried out by holding the substrate within ±30° from horizontal in order to prevent the substrate from warping.

The substrate processed in this way, indicated by numeral 1101, was cleaned. A bottom film 1102 of silicon oxide having a thickness of 2000 Å was formed by sputtering. Then, a mask 1103 was formed out of a photoresist or etchable polyimide or photosensitive polyimide (such as Photoneece manufactured by Toray Industries, Inc., Japan) on the substrate which was processed as described above. The mask was then patterned to form a region 1100 which selectively exposed the bottom film (FIG. 6(A)).

A nickel film having an average thickness of 5 to 20 Å, e.g., 10 Å, was formed by sputtering. Strictly speaking, since this film was so thin that it did not assume the form of a film. At this time, it was desired to heat the substrate to 150°–300° C. Therefore, the mask 1103 preferably has sufficient heat-proofness. Then, the mask 1103 was removed. Thereafter, an intrinsic (I-type) amorphous silicon film (intrinsic non-single crystal silicon film) 1104 having a thickness of 300 to 1500 Å, e.g., 800 Å, was formed by PCVD.

The laminate was thermally annealed at 550° C. for 8 hours or at 600° C. for 4 hours in an inert nitrogen ambient at atmospheric pressure to crystallize the amorphous film (non-single crystal silicon film). At this time, in the region 1100 in which a nickel film was selectively formed, crystallization of the crystalline silicon film 1104 progressed perpendicularly to the substrate 1101. In regions other than the region 1100, crystal growth progressed laterally, i.e., parallel to the substrate, from the region 1100 as indicated by the arrows. A region 1105 containing the surroundings of the region 1100 in which the nickel film was directly formed and the front ends of the growing crystals was heavily doped with nickel (FIG. 6(B)).

After this step, the silicon film was photolithographically patterned to form the active layer 1104' of a TFT in the form of an island. At this time, it is important that the front ends of the growing crystals do not exist in a region becoming a channel formation region. The front ends are at the interface between a crystalline silicon region and an amorphous silicon region and heavily doped with nickel. This can prevent carriers moving between the source and drain from being affected by nickel element in the channel formation region. In this step, the crystals grew 100 μm at best, which was measured from the nickel-doped region 1100 to the front ends of the growing crystals.

In the past, an annealing step for crystallization was carried out between the step of patterning the nickel-introducing mask 1103 and the step of patterning the active layer 1104'. Therefore, the substrate shrank as much as 1000 ppm. That is, for a substrate 100 mm square, it shrank as much as 50 μm vertically. This made it impossible to perform an accurate patterning step. On the other hand, in the present example, shrinkage of the substrate was suppressed below 70 ppm. That is, the substrate 100 mm square shrinks only less than 4 μm vertically. This assures implementation of an accurate patterning step.

The dimension of the active layer 1104' is determined, taking account of the channel length and the channel width of TFTs. Smaller active layers measured 50 μm by 20 μm. Larger active layers measured 100 μm by 1000 μm. Numerous active layers of this kind were formed on a substrate. A silicon oxide film 1106 having a thickness of 1200 Å was fabricated out of TEOS (tetraethoxysilane (Si(OC$_2$H$_5$)$_4$)) and oxygen by PCVD. In this way, a gate-insulating film was formed (FIG. 6(C)).

Subsequently, an aluminum film containing 0.01 to 0.2% scandium and having a thickness of 6000 to 8000 Å, e.g., 6000 Å, was formed by sputtering. This aluminum film was patterned to form gate electrodes 1107 and 1109. The surfaces of this aluminum electrodes were anodized to form oxide layers 1108 and 1110 on the surfaces. This anodic oxidation was carried out in an ethylene glycol solution containing 1 to 5% tartaric acid. The thickness of the obtained oxide layers 1108 and 1110 was 2000 Å. Since these oxide layers 1108 and 1110 determine the thickness of an offset gate region in a later ion doping step, the length of the offset gate region can be determined in the above-described anodization step.

Then, using a gate electrode portion (comprising the gate electrode 1107, the surrounding oxide layer 1108, the gate electrode 1109, and the surrounding oxide layer 1110) as a mask, an impurity was implanted into the active region (becoming the source/drain regions and the channel) to impart conductivity type P or N by self-aligning techniques and by ion doping (also known as plasma doping). Phosphine ($PH_3$) and diborane ($B_2H_6$) were used as dopant gases. Where the phosphine was used, the accelerating voltage was 60 to 90 kV, e.g., 80 kV. Where diborane was used, the accelerating voltage was 40 to 80 kV, e.g., 65 kV. The dose was $1 \times 10^{15}$ to $8 \times 10^{15}/cm^2$. For example, phosphorus was implanted at a dose of $2 \times 10^{15}/cm^2$. Boron was implanted at a dose of $5 \times 10^{15}/cm^2$. During the implantation, one region was coated with a photoresist to selectively implant the elements. As a result, N-type doped region 1114, 1116 and P-type doped regions 1111 and 1113 were formed. In this way, a region for a P-channel TFT (PTFT) and a region for an N-channel TFT (NTFT) could be formed.

Thereafter, the laminate was annealed by irradiation of laser light. The laser light was emitted by a KrF excimer laser having a wavelength of 248 nm and a pulse width of 20 nsec. Other lasers can also be used. The laser was emitted at an energy density of 200 to 400 $mJ/cm^2$, e.g., 250 $mJ/cm^2$. Two to 10 shots of laser light were emitted per location. For example, two shots were emitted. During illumination of this laser light, if the substrate may be heated to about 200° to 450° C., then the effect can be enhanced (FIG. 6(D)).

Subsequently, a silicon nitride film 1118 having a thickness of 6000 Å was formed as an interlayer insulator by PCVD. This interlayer insulator may also be made of either polyimide or a two-layer film consisting of silicon oxide and polyimide. Then, contact holes were formed. Electrodes and interconnects 1117, 1120, and 1119, of TFTs were fabricated out of a metal material such as a multilayer film of titanium nitride and aluminum. Finally, the laminate was annealed at 350° C. for 30 minutes in a hydrogen ambient at 1 atm to complete a semiconductor circuit having complementary TFTs (FIG. 6(E)).

The circuit described above is of the CMOS structure comprising complementary PTFT and NTFT. In the above step, it is also possible to fabricate the two TFTs simultaneously. Then, the substrate is cut at the center to obtain two independent TFTs at the same time.

In the present example, the method of introducing nickel consists of selectively forming a thin nickel film on the bottom film 1102 under the amorphous silicon film (non-single crystal silicon film) 1104, and crystals are grown from this portion. Since the thin film is so thin that it is difficult to observe it as a film. Alternatively, a nickel film can be selectively formed after formation of the amorphous silicon film (non-single crystal silicon film) 1104. That is, the crystal growth may be started either from the top surface of the amorphous silicon film (non-single crystal silicon film) or from the bottom surface. In a further method, an amorphous silicon film (non-single crystal silicon film) is previously formed, and nickel ions are selectively implanted into the amorphous silicon film (non-single crystal silicon film) 1104 by ion doping. In this case, the concentration of the nickel can be controlled accurately. Plasma processing and CVD may also be employed.

EXAMPLE 5

In the present example, N-channel TFTs are formed as switching devices for pixels of an active-matrix liquid crystal display. In the description made below, only one pixel is described but many other (generally hundreds of thousands of) pixels are formed similarly. Obviously, the TFTs are not limited to N-channel TFTs. P-channel TFTs can also be used. The TFTs can be used in a peripheral circuit as well as in pixels of a liquid crystal display. Furthermore, they can be used in an image sensor and other apparatus. That is, if they are used as thin-film transistors, no restriction is imposed on their application.

The process sequence of the present example is schematically shown in FIGS. 7(A)–7(E). In the present example, OA-2 substrate manufactured by Nippon Electric Glass Manufacturing Co., Ltd., Japan, was used as a substrate 1201. This substrate had a strain point of 635° C., a thickness of 1.1 mm, and measured 300 mm by 400 mm. First, the substrate was annealed at 700° C., i.e., above the strain point of the substrate, for 1 hour and then slowly cooled down to 600° C. at a rate of 0.2° C./min. Shrinkage of the substrate was reduced greatly by the thermal processing conducted in this way. For example, where the substrate was annealed at 600° C. for 4 hours, shrinkage of only 20 ppm was observed. Where the substrate was annealed at 550° C. for 4 hours, shrinkage of only 10 ppm was observed.

A bottom film 1202 of silicon oxide having a thickness of 2000 Å was formed by PCVD (plasma chemical vapor deposition) on the substrate 1201 thermally treated as described above. TEOS and oxygen were used as raw material gases in the PCVD. Subsequently, in order to selectively introduce nickel, a mask 1203 was formed out of polyimide. A nickel film having a thickness of 5 to 200 Å, e.g., 20 Å, was formed by sputtering. In this way, a nickel film was selectively formed in a region 1204 (FIG. 7(A)).

Thereafter, an amorphous silicon film (non-single crystal silicon film) 1205 having a thickness of 1000 Å was formed by LPCVD or PCVD. The laminate was then dehydrogenated at 450° C. for 1 hour, followed by thermal annealing to crystallize the amorphous film (non-single crystal film). This thermal annealing was carried out at 600° C. for 4 hours in a nitrogen ambient. In this annealing step, since a nickel film was formed in the region 1204 under the amorphous silicon film 1205, crystallization started from this portion. At this time, in the region 1204 where the nickel film was formed, silicon crystals grew vertically to the substrate 1201. In regions (regions other than the region 1204) in which the nickel film was not formed, crystal grew parallel to the substrate as indicated by the arrows (FIG. 7(B)).

After the thermal annealing step, the crystallized silicon film was photolithographically patterned to leave behind only an active layer 1205' of TFTs in the form of islands. The other portions were removed. At this time, it is important that the front ends of the growing crystals do not exist in the active region, especially in the channel formation region. More specifically, it is desired that of the silicon film 1205 shown in FIG. 7(B), at least the front ends of the growing crystals and nickel-doped region 1204 be etched away, and that intermediate crystal portions of the crystalline silicon film 1205 grown parallel to the substrate be used as the active layer. Since nickel is concentrated at the front ends of the growing crystals and in the nickel-doped regions, removal of these portions prevents the high concentration of nickel from adversely affecting the characteristics of the TFTs.

Then, a gate-insulating film 1206 of silicon oxide having a thickness of 70 to 120 nm, typically 120 nm, was formed out of TEOS by PCVD in an oxygen ambient. The substrate temperature was 350° C. (FIG. 7(C)).

Thereafter, a film consisting mainly of well-known polysilicon was formed by CVD and photolithographically patterned to form a gate electrode 1207. In order to improve the conductivity, 0.1 to 5% phosphorus was added as a dopant.

Then, phosphorus was implanted as an N-type dopant by ion doping, and a source region 1208, a channel formation region 1209, and a drain region 1210 were formed by self-aligning techniques. The laminate was annealed at 550° C. for 4 hours to improve the crystallinity of the silicon film which were deteriorated by the ion implantation. Since nickel acting to promote crystallization was contained originally, it was easy to crystallize the active layer. As a result of this thermal annealing, the sheet resistance of the source/drain regions of the TFTs assumed a value of 300 to 800 $\Omega/cm^2$ (FIG. 7(D)).

Thereafter, an interlayer insulator 1211 was formed out of silicon oxide or polyimide. Then, a pixel electrode 1212 was formed out of ITO. Contact holes were formed. Electrodes 1213 and 1214 were formed out of a multilayer film of chromium and aluminum in the source/drain regions of a TFT. One electrode 1214 was connected also with the ITO pixel electrode 1212. Finally, the laminate was annealed at 200°–400° C. for 2 hours within hydrogen to carry out hydrogenation. In this way, one TFT was completed. This step was effected at the same time in numerous other pixel regions. In order to improve the resistance to moisture, a passivation film made of silicon nitride or the like may be formed over the whole surface (FIG. 7(E)).

In the TFTs fabricated in the present example, the active layer forming the source regions, the channel formation regions, and the drain regions is made of a crystalline silicon film grown in the direction in which carriers flow and so the carriers do not cross crystal grain boundaries. That is, the carriers move along the grain boundaries of crystal whiskers taking a filamentary form. Therefore, TFTs having a high carrier mobility can be fabricated. The TFTs fabricated in the present example were of the N-channel type. The mobility was 90 to 130 $cm^2/V.s$, which is a great improvement over the mobility of 50 to 70 $cm^2/V.s$ of prior art N-channel TFTs using a crystalline silicon film formed by crystallization caused by a thermal anneal conducted at 600° C. for 48 hours.

In the present example, thermal annealing is utilized to activate the implanted dopant. This causes a milder reaction than the reaction induced by irradiation of laser radiation as in the case of Example 4. Especially, where laser annealing was used, discontinuity of crystallinity at the interface between the shadow portion of the gate electrode and the irradiated portion resulted in a decrease in the reliability. In the present example, the channel formation region and the source/drain regions are heated uniformly. In consequence, the manufactured TFTs have especially excellent reliability.

EXAMPLE 6

The present example is described by referring to FIGS. 3(A)–3(E). Corning 1733 glass having a strain point of 640° C. was used as a substrate 301. The glass substrate 301 was annealed at 700° C., i.e., above the strain point, for 1 hour and then slowly cooled down to 600° C. at a rate of 0.2° C./min. A bottom film 302 was formed on the glass substrate 301 by PCVD. An amorphous silicon film (non-single crystal silicon film) 304 having a thickness of 300 to 800 Å was formed by PCVD. Then, using a 1000 Å-thick-mask 303 of silicon oxide, a nickel film was formed in a region 300 in the same way as in Example 4. The laminate was thermally annealed at 550° C. for 8 hours to crystallize the silicon film 304. At this time, crystals grew parallel to the substrate as indicated by the arrows (FIG. 3(A)).

The silicon film 304 was photolithographically patterned to form active layer regions 306 and 307 in the form of islands. Nickel was directly introduced in the region 300 (FIG. 3(A)). This region 300 was heavily doped with nickel. As described already in Examples 4 and 5, nickel existed also at a high concentration at the end points of the crystal growth. We have found that the concentration of nickel in these regions is higher than the concentration of nickel in the intervening crystallized region by almost one order of magnitude. Therefore, in the present invention, the patterning step was so carried out that the heavily doped regions were intentionally removed to leave behind the active layer regions 306 and 307 for forming active devices such as TFTs. The active layer was etched by an RIE method having vertical anisotropy (FIG. 3(B)).

In the present example, a complementary TFT circuit is built, utilizing the active layers 306 and 307. That is, the circuit according to the present invention differs from the configuration of Example 4 shown in FIG. 6(D) in that PTFT and NTFT are separated from each other. More specifically, in the structure shown in FIG. 6(D), the active layers of two TFTs are continuous. The concentration of nickel in the intervening region is high. The present example is characterized in that the concentration of nickel is low everywhere. This can enhance the stability of operation.

Then, a silicon oxide film or silicon nitride film 308 having a thickness of 200 to 3000 Å was formed by PCVD. Subsequently, a lamp annealing using infrared light or near-infrared light was carried out. A halogen lamp was used as an infrared light source. The used wavelength was 0.5 to 4 μm, preferably 0.8 to 1.3 μm, which was well absorbed by crystalline silicon. The intensity of the visible light or near-infrared light was so adjusted that the temperature on the single-crystal silicon monitor wafer was between 800° and 1300° C., typically between 900 and 1200° C. More specifically, the temperature of a thermocouple buried in the silicon wafer was monitored. The resulting signal was fed back to the infrared light source. The infrared light irradiation was effected in a $H_2$ ambient, which may contain 0.1 to 10% HCl, other halogenated hydrogen, a fluorine compound, a chlorine compound, or bromine compound.

In the present example, the protective film of silicon oxide or silicon nitride is formed on top of the active layer during irradiation of visible light or near-infrared light. This could prevent the surface from roughening or becoming contaminated during irradiation of infrared radiation. The crystallinity which cannot be enhanced sufficiently only with crystallization owing to thermal annealing could be improved sufficiently by using such a lamp annealing step at the same time (FIG. 3(C)).

After irradiation of the visible light or near-infrared light, the protective film 308 was removed. Thereafter, a gate-insulating film 309 and gate electrodes 310, 311 were formed in the same way as in Example 4. The gate electrodes were made from tantalum. A coating of tantalum oxide was formed on the surface of the gate electrodes to a thickness of 1000 to 3000 Å, e.g., 3000 Å, by anodic oxidation. Then, an impurity element was implanted by ion doping, in the same way as in Example 4, and source/drain regions were formed.

Lamp annealing was used to activate this impurity. A halogen lamp was used as the light source of the infrared light. Visible light or infrared light having wavelengths of 0.5 to 4 μm, preferably 0.8 to 1.3 μm, was irradiated for 30 to 180 seconds. Visible and infrared light lying in this wavelength range can be easily absorbed by amorphous silicon doped with phosphorus or boron at a concentration of $10^{19}$ to $10^{21}$ cm$^{-3}$. An effective anneal comparable to a thermal anneal conducted above 1000° C. can be carried out. On the other hand, this radiation is not readily absorbed by glass substrate and so it is not overheated. Also, the processing can be completed in a short time. Therefore, it can be said that this is the best method for a step where shrinkage of a glass substrate is a problem. This method is more appropriate in the present example because the substrate has been previously processed to prevent its shrinkage.

The intensity of the visible light or near-infrared light was so adjusted that the temperature on the single crystal silicon monitor wafer was between 800° and 1300° C., typically between 900° and 1200° C. More specifically, the temperature of a thermocouple buried in the silicon wafer was monitored. The resulting signal was fed back to the infrared light source. The infrared light irradiation was effected in a $H_2$ ambient, which may contain 0.1 to 10% HCl, other halogenated hydrogen, a fluorine compound, a chlorine compound, or a bromine compound (FIG. 3(D)).

Thereafter, an interlayer insulator 312 was formed, and contact holes were formed in the insulator. Metallic interconnects 313, 314, and 315 were formed. Finally, the laminate was annealed at 250°–400° C., e.g., 350° C., at 1 atm within a hydrogen ambient to carry out hydrogenation (FIG. 3(E)).

In this way, a complementary TFT circuit was completed. In the present example, during the lamp anneal, i.e., irradiation of visible light or near-infrared light, the protective film was formed on the surface of the active layer and so the surface was prevented from roughening or becoming contaminated. Consequently, TFTs fabricated in the present example had excellent characteristics including excellent field mobility and threshold voltage and quite high reliability.

EXAMPLE 7

The present example is an example of a complementary combination of a P-channel TFT (PTFT) and an N-channel TFT (NTFT). These TFTs use a crystalline silicon film formed on a glass substrate as shown in FIGS. 9(A)–9(D). The configuration of the present example can be used for switching devices for pixel electrodes for an active-matrix liquid crystal display, a peripheral driver circuit, an image sensor, and a three-dimensional IC.

Figure 8:
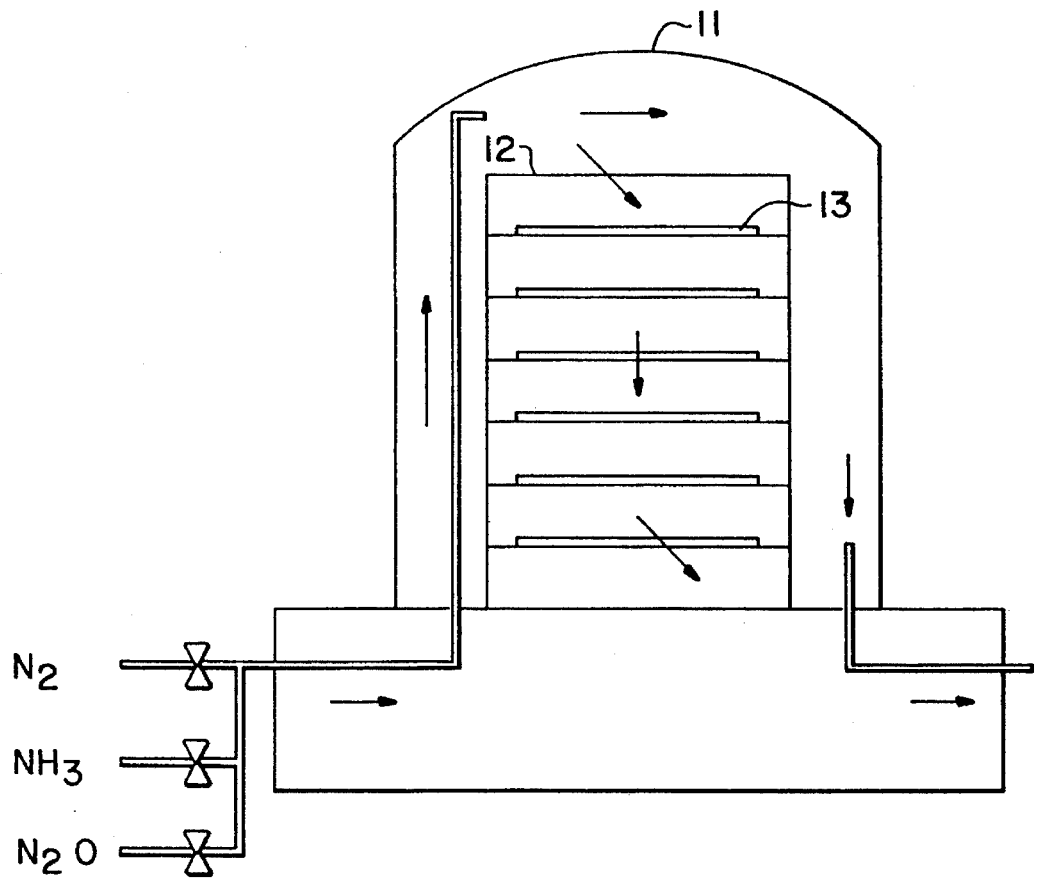
FIG. 8 is a schematic diagram of a heating furnace.
Figure 9A:
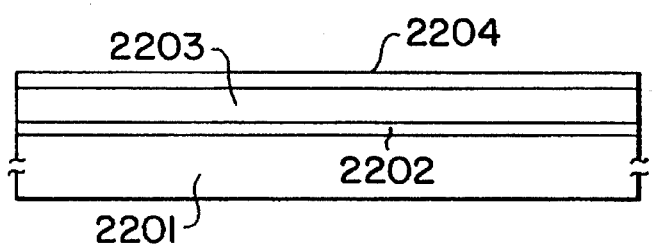
FIGS. 9(A)–9(D) are a cross-sectional view of TFTs according to the invention, illustrating successive steps for fabricating the TFTs.
Figure 9B:
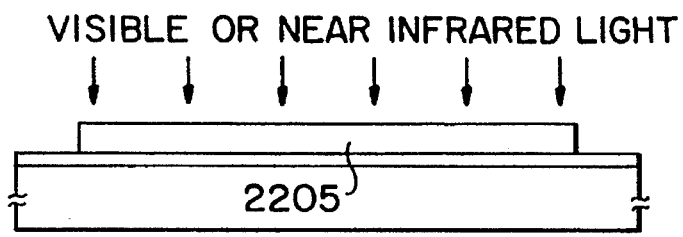
Figure 9C:
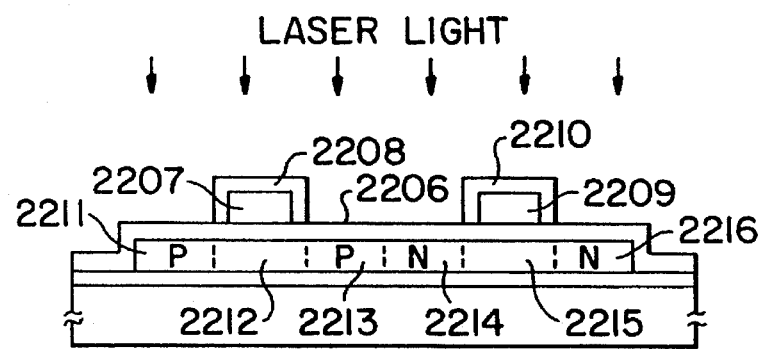
Figure 9D:
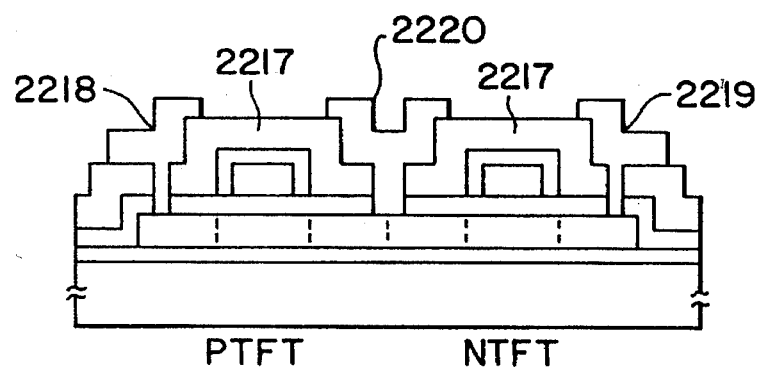

In the present example, Corning 7059 glass was used as each substrate. First, the glass substrates were subjected to preheating processing. This step was carried out at 640° C., i.e., above the strain point of 593° C. of the glass, for 4 hours. In this step, a heating furnace as shown in FIG. 8 was used. The plural substrates, indicated by 13, were held horizontal during this step. The ambient of the heating processing was nitrogen (1 atm). In order to prevent the substrates from warping, it is desired to carry out this thermal processing at an angle of less than ±30 degrees from horizontal.

After the end of the heating processing, each glass substrate was cooled at a rate between 0.01° C./min and 0.5° C./min, e.g., 0.2° C./min. To control the cooling rate, a gas containing nitrogen such as nitrogen gas ($N_2$), ammonia ($NH_3$), or dinitrogen monoxide ($N_2O$) was used, and the flow of the gas introduced was varied. In this slow cooling step, each glass substrate shrinks more than 1000 ppm. If nitrogen, ammonia, or dinitrogen monoxide is used during the cooling subsequent to the preheating processing, then the surface of the glass substrate and its vicinity can be nitrided by the gas. This could prevent impurities in the glass, such as boron, barium, and sodium from being deposited in a semiconductor formed in a later step. This was effective in forming reliable semiconductor devices.

As shown in FIGS. 9(A)–9(D), a bottom film 2202 of silicon oxide having a thickness of 2000 Å was formed on each substrate 2201 made of Corning 7059 glass by sputtering or CVD. The formation of this bottom film may also be carried out before the aforementioned preheating processing.

Then, an intrinsic (I-type) amorphous silicon film (intrinsic non-single crystal silicon film) 2203 having a thickness of 300 to 1500 Å, e.g., 800 Å, was formed by PCVD. A silicon oxide film 2204 having a thickness of 100 to 800 Å, e.g., 200 Å, was formed on the amorphous silicon film (non-single crystal silicon film) 2203 by PCVD. This would act as a protective film in later thermal annealing steps and prevent the film surfaces from roughening (FIG. 9(A)).

Thereafter, the laminate was thermally annealed at 600° C. for 8 hours in a nitrogen ambient at 1 atm. As a result of this thermal annealing, the amorphous silicon film (non-single crystal silicon film) 2203 was crystallized. The crystallized silicon film was quickly cooled at a rate of 2° C./min. or more, preferably 10 to 300° C./min, e.g., about 50° C./min, to a temperature lower than the stain point of the glass by 100° C. (in this case, down to 493° C.). At this time, a shrinkage of 0 to 44 ppm (on average, less than 20 ppm) of the glass substrate was observed. Also during this step, the heating furnace shown in FIG. 8 was used.

On the other hand, a glass substrate was not subjected to the above-described preheating processing at 640° C. A bottom film and an amorphous silicon film were formed on the glass substrate. The laminate was thermally annealed at 600° C. for 8 hours. A shrinkage exceeding 1000 ppm was observed.

In other crystallization according to the present invention, a film containing a material for promoting crystallization such as Ni or Pb is formed on the top surface or on the bottom surface of the amorphous silicon film (non-single crystal silicon film) or this material is implanted into the amorphous silicon film (non-single crystal silicon film) by ion implantation prior to the crystallization of the amorphous silicon film (non-single crystal silicon film) induced by the heating, crystals can be grown parallel to the substrate by heating from regions to which the material for promoting crystallization such as Ni or Pb is added. Also, where silicon ions are selectively implanted, selective crystal growth can be done.

In this case, it is necessary that before the heating step for crystallization, a mask be formed, films be formed, and ions be implanted. During heating steps, shrinkage of the substrate must be minimized. Accordingly, in this case, the present invention capable of suppressing shrinkage of the glass substrate is advantageous.

Data about shrinkage of glass substrates each consisting of Corning 7059 glass in the present example is shown in FIG. 10. The substrates were subjected to preheating processing under the same conditions. Then, a bottom film was formed on each substrate. Subsequently, an amorphous silicon film was formed. The laminates were heated and crystallized under different conditions. FIG. 10 shows data about the final shrinkage of each substrate.

As can be seen from FIG. 10, where the glass substrate is heated to a temperature lower than the transition point (in this case, 628° C.) of the glass substrate, i.e., where the heating processing temperature is within at least ±100° C. from the strain point of the glass, as the cooling rate is increased, the resulting shrinkage of the substrate is reduced.

After the crystallization of the amorphous silicon film (non-single crystal silicon film) 2203 owing to heating, the protective film 2204 was removed. The silicon film 2203 was photolithographically patterned to form the active layer 2205 of a TFT in the form of an island. The size of the active layer 2205 was determined, taking account of the channel length and the channel width of the TFT. Smaller active layers measured 50 μm by 20 μm. Larger active layers measured 100 μm by 1000 μm.

Then, the laminate was irradiated with infrared light having a peak at 0.6 to 4 μm, 0.8 to 1.4 μm in this example, for 30 to 180 seconds to anneal the active layer 2205. This anneal was conducted to enhance the crystallinity of the active layer 2205.

At this time, the irradiation of the infrared light heated the active layer 2205 to 800°–1300° C., typically 900°–1200° C., e.g., to 1100° C. This temperature was not the actual temperature on the glass because it transmitted light. Rather, the temperature was the temperature on a silicon wafer which was used as a monitor wafer. To improve the state of the surface of the active layer, the irradiation was carried out in a $H_2$ ambient. In the present step, the active layer was selectively heated and so temperature rise of the glass substrate could be reduced to a minimum. This was quite effective in reducing the defects and dangling bonds in the active layer (FIG. 9(B)).

A halogen lamp was used as a light source of the infrared light. The intensity of the visible light or near-infrared light was so adjusted that the temperature on the single silicon crystal monitor wafer was between 800° and 1300° C., typically between 900° and 1200° C. More specifically, the temperature of a thermocouple buried in the silicon wafer was monitored. The resulting signal was fed back to the infrared light source. We estimate that the temperature on the surface of the silicon on the glass substrate has decreased to about ⅔ of the original temperature. In the present example, the temperature was elevated at a constant rate of 50° to 200° C./min. The temperature was rapidly lowered by natural cooling at a rate of 20° to 100° C./min.

During irradiation of infrared light, it is desired to form a protective film of silicon oxide or silicon nitride on the surface because the protective film improves the state of the surface of the silicon film 2205. In the present example, in order to improve the state of the surface of the silicon film 2205, the irradiation was carried out within a $H_2$ ambient, which may contain 0.1 to 10% by volume of HCl, other halogenated hydrogen, a fluorine compound, a chlorine compound, or a bromine compound.

The irradiation of visible light or near-infrared light selectively heated the crystallized silicon film and so temperature rise of the glass substrate could be reduced to a minimum. This was quite effective in reducing the defects and dangling bonds in the active layer. After this step, if a hydrogen anneal is carried out at 200° to 500° C., typically at 350° C., defects can be reduced effectively. The same effect can be produced if the silicon film is doped with hydrogen at $1\times10^{13}$ to $1\times10^{15}$ $cm^{-2}$ and then the film is thermally treated at 200° to 300° C.

After the irradiation of the infrared light, a silicon oxide film 2206 having a thickness of 1000 Å was formed as a gate-insulating film by PCVD. TEOS $(Si(OC_2H_5)_4)$ and oxygen were used as raw material gases for the CVD. During the formation of the film, the substrate temperature was 300° to 550° C., e.g., 400° C.

After the formation of the silicon oxide film 2206 becoming a gate-insulating film, an optical anneal using irradiation of visible light or near-infrared light was carried out under the same conditions as in the aforementioned step of irradiating infrared light. This anneal could annihilate mainly energy levels at and around the interface between the silicon oxide film 2206 and the silicon film 2205. This is quite useful for an insulated gate field-effect transistor for which the characteristics of the interface between the gate-insulating film and the channel formation region is quite important.

Subsequently, an aluminum film having a thickness of 6000 to 8000 Å, e.g., 6000 Å, was formed by sputtering techniques. The aluminum contained 0.01 to 0.25% by weight of a rare-earth element belonging to group IIIa of the Periodic Table. Instead of aluminum, an element belonging to group IIIb can be used. The aluminum film was patterned to form gate electrodes 2207 and 2209. The surfaces of the aluminum electrodes were anodized to form oxide layers 2208 and 2210 on the surfaces. This anodic oxidation was effected within an ethylene glycol solution containing 1 to 5% tartaric acid. The thickness of the obtained oxide layers 2208 and 2210 was 2000 Å. These oxide layers 2208 and 2210 determine the thickness of an offset gate region in a later ion doping step and so the length of the offset gate region can be determined in the anodic oxidation step.

Then, using a gate electrode portion (comprising the gate electrode 2207, the surrounding oxide layer 2208, the gate electrode 2209, and the surrounding oxide layer 2210) as a mask, an impurity was implanted into the silicon layer 2205 to impart conductivity type P or N by self-aligning techniques and by ion doping (also known as plasma doping). Phosphine $(PH_3)$ and diborane $(B_2H_6)$ were used as dopant gases. Where the phosphine was used, the accelerating voltage was 60 to 90 kV, e.g., 80 kV. Where the diborane was used, the accelerating voltage was 40 to 80 kV, e.g., 65 kV. The dose was $1\times10^{14}$ to $8\times10^{15}/cm^2$. For example, phosphorus was implanted at a dose of $2\times10^{15}/cm^2$. Boron was implanted at a dose of $5\times10^{15}/cm^2$. During the implantation, one region was coated with a photoresist to selectively implant the elements. As a result, N-type doped region 2214, 2216 and P-type doped regions 2211, 2213 were formed. In this way, a region for a P-channel TFT (PTFT) and a region for an N-channel TFT (NTFT) could be formed.

Thereafter, the laminate was annealed by irradiation of laser light. The laser light was emitted by a KrF excimer laser having a wavelength of 248 nm and a pulse width of 20 nsec. Other lasers can also be used. The laser was emitted at an energy density of 200 to 400 $mJ/cm^2$, e.g., 250 $mJ/cm^2$. Two to 10 shots of laser light were emitted per location. For example, two shots were emitted. During illumination of this laser light, if the substrate is heated to about 200° to 450° C., then the effect can be enhanced (FIG. 9(C)).

This step may utilize lamp annealing that makes use of visible light or near-infrared light. Visible and near-infrared radiation is easily absorbed by crystallized silicon and by amorphous silicon doped with phosphorus or boron at a dose of $10^{17}$ to $10^{21}$ cm$^{-3}$. This lamp anneal is comparable to thermal annealing carried out above 1000° C. If phosphorus or boron is added, the impurity scatters light. Therefore, even infrared light is sufficiently absorbed. This can be sufficiently estimated from the fact that the silicon is observed to be black with the naked eye. On the other hand, near-infrared light is not readily absorbed by the glass substrate and so the substrate is not overheated. Furthermore, the processing can be performed in a short time. Therefore, it can be said that this is the best method for a step where shrinkage of a glass substrate is a problem. This method is more appropriately utilized in the present example because the substrate has been previously processed to prevent its shrinkage.

Subsequently, a silicon oxide film 2217 having a thickness of 6000 Å was formed as an interlayer insulator by PCVD. This interlayer insulator may also be made of either polyimide or a two-layer film consisting of silicon oxide and polyimide. Then, contact holes were formed. Electrodes and interconnects 2218, 2220, and 2219 of TFTs were fabricated out of a metal material such as a multilayer film of titanium nitride and aluminum. Finally, the laminate was annealed at 350° C. for 30 minutes in a hydrogen ambient at 1 atm to complete a semiconductor circuit having complementary TFTs (FIG. 9(D)).

The circuit described above is of the CMOS structure comprising complementary PTFT and NTFT. In the above step, it is also possible to fabricate the two TFTs simultaneously. Then, the substrate is cut at the center to obtain two independent TFTs at the same time.

EXAMPLE 8

In the present example, N-channel TFTs are formed as switching devices for pixels of an active-matrix liquid crystal display. In the description made below, only one pixel is described but many other (generally hundreds of thousands of) pixels are formed similarly. Obviously, the TFTs are not limited to N-channel TFTs. P-channel TFTs can also be used.

Figure 11A:
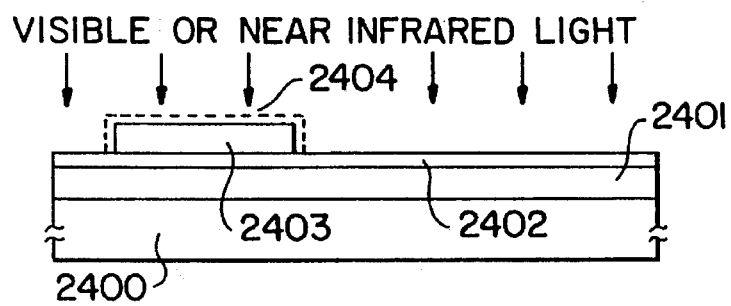
FIGS. 11(A)–11(C) are a cross-sectional view of other TFTs according to the invention, illustrating successive steps for fabricating the TFTs.
Figure 11B:
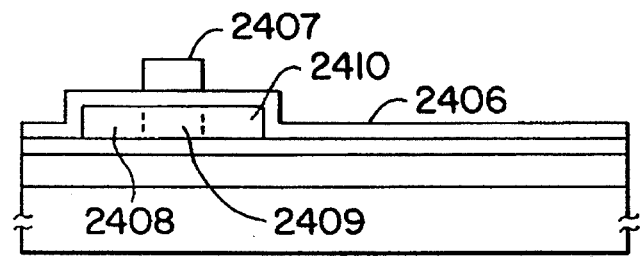
Figure 11C:
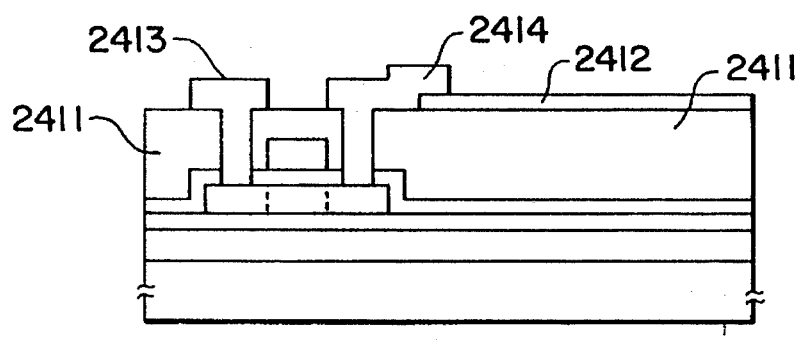
Figure 12A:
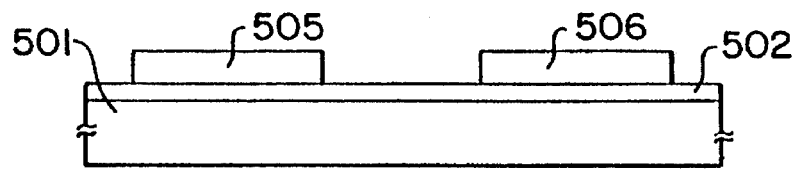
FIGS. 12(A)–12(D) are a cross-sectional view of other TFTs according to the invention, illustrating successive steps for fabricating the TFTs.
Figure 12B:
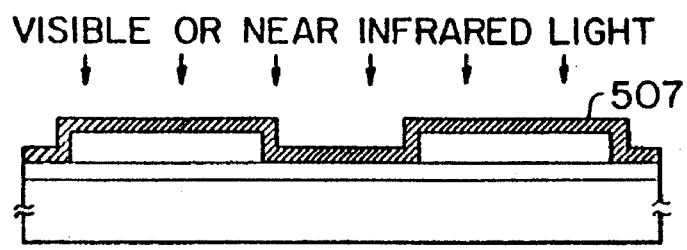
Figure 12C:
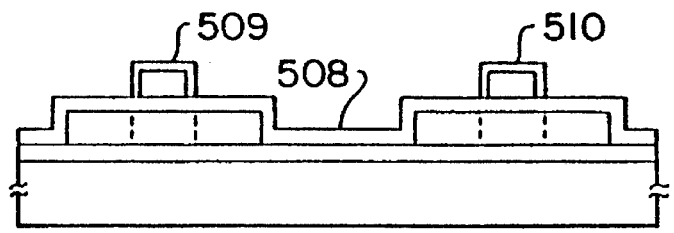
Figure 12D:
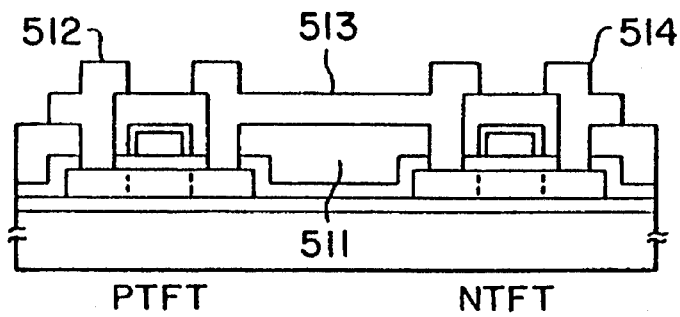

The process sequence of the present example is schematically shown in FIGS. 11(A)–11(C). In the present example, Corning 7059 glass was used as a substrate 2400. This substrate had a thickness of 1.1 mm and measured 300 mm by 400 mm. First, an aluminum nitride film 2401 having a thickness of 1000 to 5000 Å, typically 2000 Å, was formed on the substrate by sputtering or reactive sputtering etching. Since the aluminum nitride film has a high degree of transparency and suppresses movement of ions, the film effectively prevents movable ions from diffusing from the substrate 2400 into the TFT regions. A silicon oxide film 2402 was formed as a bottom film to a thickness of 2000 Å by PCVD (not shown).

Then, the laminate was heat-treated at 640° C. for 4 hours within nitrogen. Subsequently, the laminate was slowly cooled at a rate of 0.1° C./min within ammonia. This step produces desirable results if the rate is less than 0.5° C./min. In this step, the glass substrate having the bottom film thereon can be shrunk previously. Also during this step, the heating furnace shown in FIG. 8 was used.

Thereafter, an amorphous silicon film (non-single crystal silicon film) having a thickness of 1000 Å was formed by PCVD. A mask was then fabricated out of a photoresist. Silicon ions were implanted to a portion becoming a channel formation region. At this time, the implanted silicon ions were made to pass through the vicinities of the center of the silicon film.

Subsequently, the mask was removed, and the laminate was thermally annealed at 550° C. for 8 hours. During this step, only the regions already doped with the silicon ions were crystallized. After this step, the laminate was rapidly cooled at a rate exceeding 50° C./min. This step may also utilize a method of consisting of taking the laminate out of the heating furnace and cooling the laminate by natural cooling.

Then, the silicon film was lithographically patterned to leave behind the active layer 2403 of a TFT in the form of an island. The central portion of this island 2403 was already implanted with silicon ions and would become a channel formation region. In this structure, only the channel formation region had a high degree of crystallinity.

The active layer 2403 in the form of an island was irradiated with visible light or near-infrared light in an ambient of oxygen or dinitrogen monoxide to improve the crystallinity of the silicon film. A silicon oxide film 2404 having a thickness of 50 to 200 Å, typically 100 Å, was formed on the surface of the island. The temperature was 1100° C., and the time was 30 seconds. This step of forming the silicon oxide film 2404 may also be carried out by heating the laminate to 550° to 650° C. in an ambient of oxygen or dinitrogen monoxide. Obviously, the apparatus shown in FIG. 8 was used for this purpose (FIG. 11(A)).

Then, a gate-insulating film 2406 having a thickness of 500 to 3000 Å, typically 1200 Å, was formed out of aluminum nitride by a sputtering method using a target of aluminum nitride or by a reaction sputtering method using a target of aluminum. The substrate temperature was 350° C. As a result, two layers were created. That is, one layer was a thin silicon oxide film 2404 formed by thermal oxidation, while the other was the aluminum nitride film 2406 formed by sputtering. Since the dielectric constant of aluminum nitride is more than five times as great as the dielectric constant of silicon oxide, the use of aluminum nitride is effective in reducing the threshold voltages of TFTs, especially the threshold voltage of P-channel TFTs. Furthermore, less localized centers are produced in aluminum nitride than in silicon nitride and so aluminum nitride is preferable as the material of a gate-insulating film.

Thereafter, a film consisting mainly of well-known polysilicon was formed by LPCVD and photolithographically patterned to form a gate electrode 2407. In order to improve the conductivity, 0.1 to 5 atomic % of phosphorus was added as a dopant (FIG. 11(B)).

Then, phosphorus was implanted as an N-type dopant by ion doping, and a source region 2408, a channel formation region 2409, and a drain region 2410 were formed simultaneously by self-aligning techniques. The laminate was irradiated with light emitted by a KrF laser to improve the crystallinity of the silicon film which were deteriorated by the ion implantation. The energy density of the laser light was 250 to 300 mJ/cm$^2$. As a result of this laser irradiation, the sheet resistance of the source/drain regions of the TFTs assumed a value of 300 to 800 Ω/cm$^2$. In the case of a low-doped drain structure having a dose lower than conventional, the sheet resistance was 10 to 200 kΩ/square. The laser annealing step may be replaced by lamp annealing making use of visible light or near-infrared light.

Thereafter, an interlayer insulator 2411 was formed out of silicon oxide or polyimide. Then, a pixel electrode 2412 was formed out of ITO. Contact holes were formed. Electrodes 2413 and 2414 were formed out of a multilayer film of chromium and aluminum in the source/drain regions of a TFT. One electrode 2414 was connected also with the ITO pixel electrode 2412. Finally, the laminate was annealed at 200°–400° C. for 2 hours within hydrogen to carry out hydrogenation. In this way, one TFT was completed (FIG. 11(C)).

EXAMPLE 9

The present example is described now by referring to FIGS. 12(A)–12(D). Corning 7059 glass having a strain point of 550° to 650° C. was used as a glass substrate. To prevent shrinkage, the glass substrate was annealed at 640° C. for 4 hours within nitrogen. Then, the substrate was slowly cooled down to 450° C. at a rate of 0.1° C./min within nitrogen. Thereafter, the substrate was taken out of the heating furnace and then used.

First, a bottom film 502 was formed on the substrate, indicated by 501. An amorphous silicon film (non-single crystal silicon film) having a thickness of 300 to 800 Å was formed by PCVD. The laminate was thermally annealed at 600° C. for 1 hour. Thereafter, the laminate was rapidly cooled down to 450° C. at a rate of 2° to 200° C./min, preferably at a rate in excess of 10° C./min to prevent the substrate from shrinking. If the used heating furnace does not permit this rapid cooling, then the same advantage can be obtained by taking the substrate out of the furnace and maintaining the substrate at room temperature. Also during this step, the heating furnace shown in FIG. 8 was used.

In the present example, since the thermal annealing temperature was higher than the strain point (593° C.) of the Corning 7059 glass, it was difficult to suppress shrinkage even if previous heat treatment and slow cooling were carried out. In this case, rapid cooling from the thermal annealing temperature produces desirable effects.

Then, the silicon film was photolithographically patterned to form active regions 505 and 506 in the form of islands. The active regions were etched by RIE having vertical anisotropy (FIG. 12(A)).

Thereafter, a silicon oxide film or silicon nitride film 507 having a thickness of 200 to 3000 Å was formed by PCVD. Where the silicon oxide film was formed, LPCVD or photo-assisted CVD may also be used. Then, the laminate was treated with visible light or near-infrared light under the same conditions as in Example 7. In the present example, during irradiation of visible light or near-infrared light, a protective film of silicon oxide or silicon nitride was formed on the surfaces of the active layers. This could prevent the surface from roughening or becoming contaminated during irradiation of infrared light (FIG. 12(B)).

After the irradiation of the visible light or near-infrared light, the protective film 507 was removed. Thereafter, a gate-insulating film 508, a gate electrode, a surrounding oxide layer 509, another gate electrode, and a surrounding oxide layer 510 were formed, in the same way as in Example 7. Doped regions were formed by ion doping and activated by laser irradiation (FIG. 12(C)).

Thereafter, an interlayer insulator 511 was formed, and contact holes were formed in the insulator. Metallic interconnects 512, 513, and 514 were formed (FIG. 12(D)).

In this way, a complementary TFT circuit was completed. In the present example, during irradiation of visible light or near-infrared light, a protective film was formed on the surfaces of the active layers. This could prevent the surfaces from roughening or becoming contaminated during irradiation. Therefore, TFTs of the present example had quite excellent characteristics, such as field mobility and threshold voltage, and quite high reliability. Furthermore, as can be seen from the present example, the present invention can be applied with especially great utility to glass substrate materials having strain points of 550° to 650° C. In the present invention, if the slow cooling step is carried out within an ambient containing a gas including nitrogen such as nitrogen, ammonia, or dinitrogen monoxide, then the glass is nitrided. This suppresses diffusion and deposition of various impurity elements contained in the glass onto the glass surface. Hence, semiconductor devices having high reliability can be manufactured.

EXAMPLE 10

This example is to be explained according to FIG. 13. As a substrate, NA 45 glass (strain point 610° C.) of NH Technoglass Co. is utilized. Two-layered base film is formed on a glass substrate 601 by a plasma CVD method. First of all, a silicon nitride film 602 is formed on the substrate by 1000 Å, and a silicon oxide film 603 is formed on it by 1000 Å. Deposition of these films are performed in a series. The silicon nitride film 602 is formed to prevent pollution by movable ions in the glass substrate.

The substrate is annealed in an atmosphere of dinitrogen monoxide ($N_2O$) at 650° C. which is not lower than the strain point for an hour, and is cooled to 500° C. at 0.2° C./min. An amorphous silicon film (non-single crystal silicon film) 604 is deposited by a plasma CVD method by 300 to 800 Å thickness, for example, by 500 Å. A mask 605 of silicon oxide then is formed by 1000 Å thickness. A nickel acetate film 606 is formed in contact with the silicon film 604 by a spin coating method utilizing nickel acetate solution. Concentration of nickel is 50 to 300 ppm, such as 100 ppm. Here, because the nickel acetate film 606 is as very thin as several to several ten Å, this film has not necessarily become a film. (FIG. 13(A))

Thermal annealing is performed at 550° C. for eight hours, and an amorphous silicon film (non-single crystal silicon film) 604 is crystallized. Crystal growth proceeds in the parallel direction with the substrate as shown by an arrow.

After the mask 605 (it is also a protection film from crystallization annealing) is removed, laser crystallization is performed to improve crystal characteristics. By irradiating KrF excimer laser light (wavelength 248 nm) at 200 to 300 $mJ/cm^2$, a crystalline silicon film 607 is obtained. (FIG. 13(B))

Figure 13A:
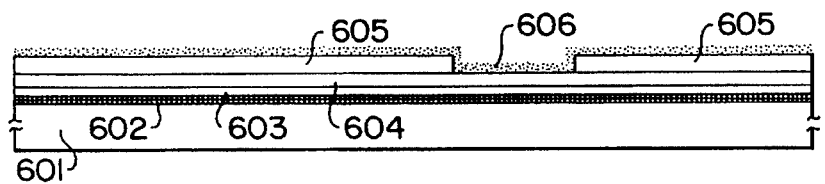
FIGS. 13(A)–13(G) are a cross-sectional view of other TFTs according to the invention, illustrating successive steps for fabricating the TFTs.
Figure 13B:
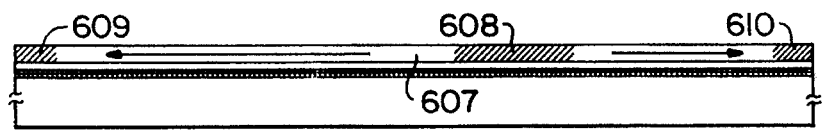
Figure 13C:
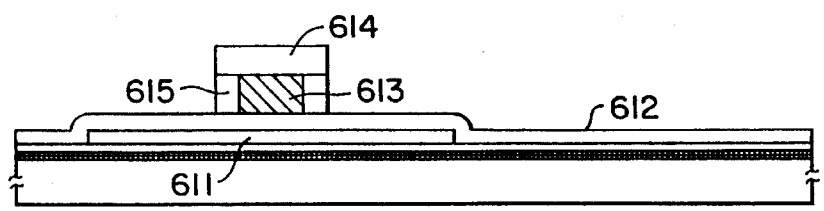
Figure 13D:
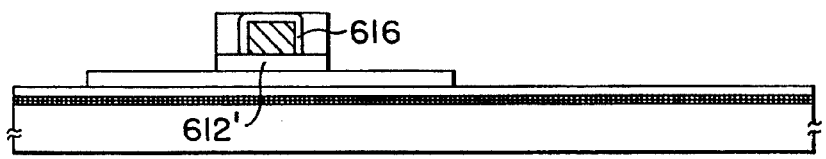
Figure 13E:
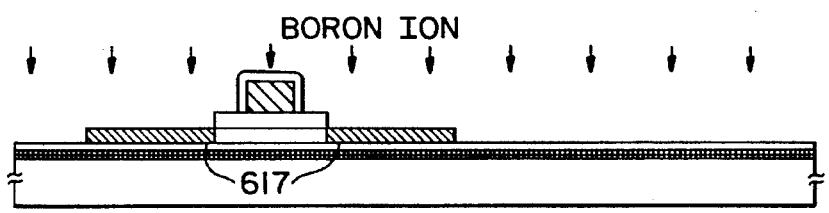
Figure 13F:
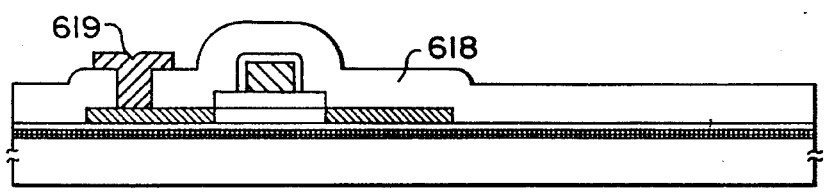
Figure 13G:
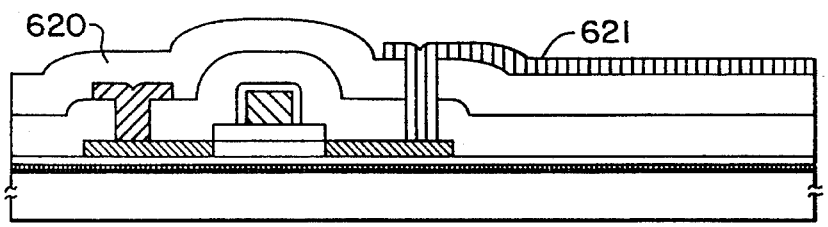
Figure 14A:
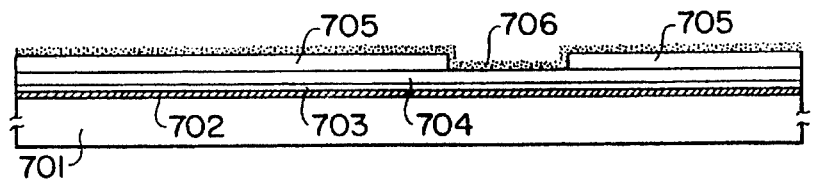
FIGS. 14(A)–14(G) are a cross-sectional view of other TFTs according to the invention, illustrating successive steps for fabricating the TFTs.
Figure 14B:
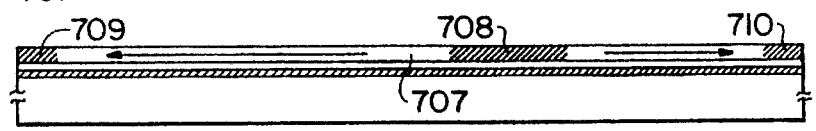
Figure 14C:
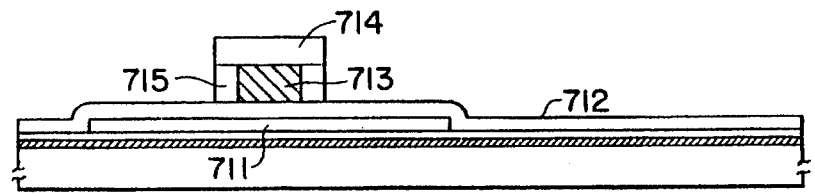
Figure 14D:
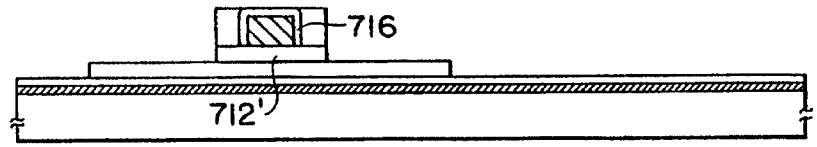
Figure 14E:
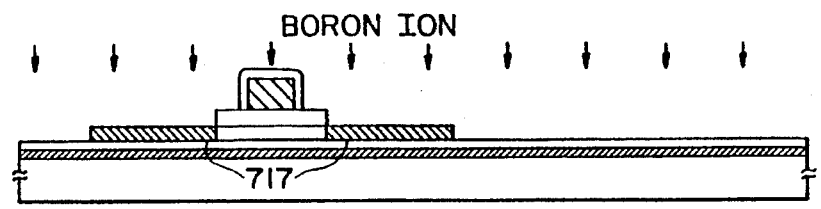
Figure 14F:
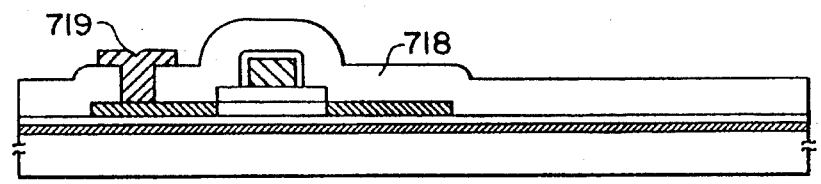
Figure 14G:
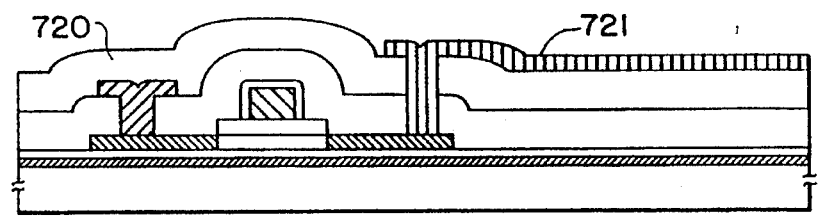
Figure 15A:
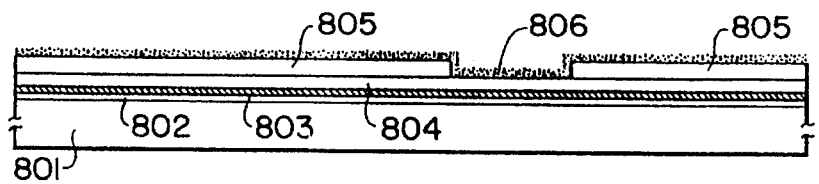
FIGS. 15(A)–15(G) are a cross-sectional view of other TFTs according to the invention, illustrating successive steps for fabricating the TFTs.
Figure 15B:
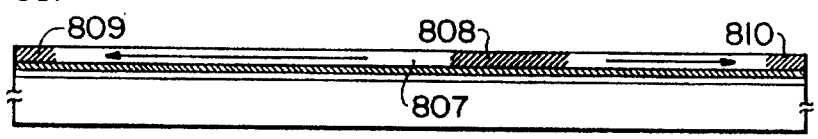
Figure 15C:
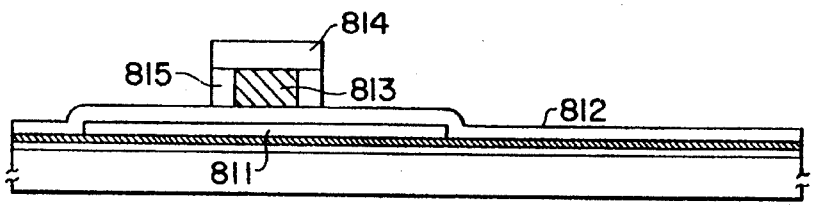
Figure 15D:
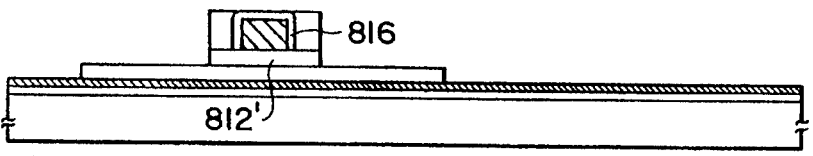
Figure 15E:
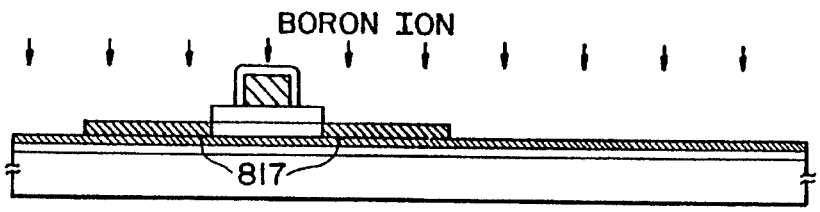
Figure 15F:
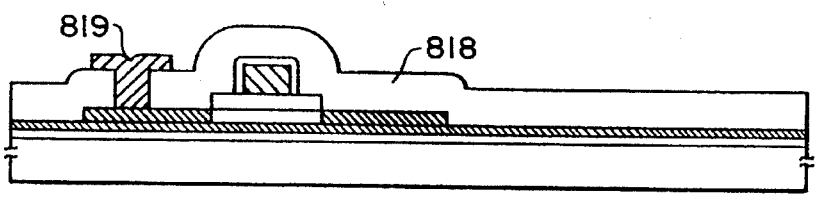
Figure 15G:
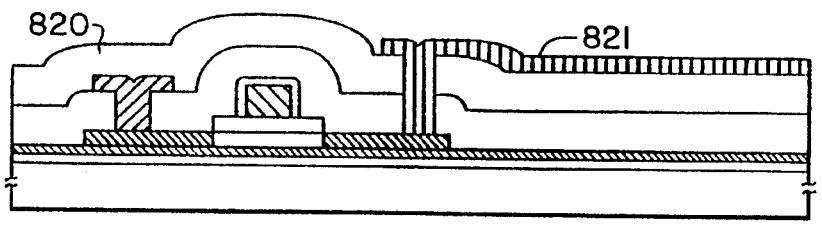

The crystalline silicon film 607 is patterned, and an island active layer region 611 is formed. The region shown as 608 in FIG. 13(B) is the region to which nickel has been directly introduced, and which has nickel at a high concentration. As is shown in Embodiments 1 and 2, nickel also exists at a high concentration at terminal points 609 and 610 of crystal growth. It has been found these regions have nickel at a concentration nearly a digit higher than that of other crystallized regions. In this embodiment, an active layer region being a region for forming an active element, e.g. a pixel TFT is patterned preventing these regions with high concentration of nickel, and thus the regions with nickel at a high concentration are removed intentionally. Etching of the active layer is performed by RIE method having anisotropy in vertical direction.

A silicon oxide film is formed by 200 to 3000 Å thickness, e.g. 1000 Å as a gate insulating film 612 by a plasma CVD method.

An aluminum (including Si of 1 wt %, or Sc of 0.1 to 0.3 wt %) film of 1000 Å to 3 μm thickness, e.g. 5000 Å thickness is formed by a sputtering method. Photoresist is formed by a spin coating method. By forming an aluminum oxide film of 100 to 1000 Å thickness on the surface by an anodic oxidation method before formation of the photoresist, adhesion of the photoresist becomes better. After that, the photoresist and the aluminum film are patterned, thus a gate electrode 613 is formed. Even after etching is finished, the photoresist is not taken off, and is left as a mask film 614 on the gate electrode 613.

Porous anodic oxidation is performed to this in an electrolyte by flowing current in the electrolyte, and porous anodic oxide 615 is formed by 3000 to 6000 Å, e.g. 5000Å thickness. Porous anodic oxidation is performed by utilizing an oxide solution like citric acid, nitric acid, phosphoric acid, chromic acid, or sulfuric acid of 3 to 20%, and by applying a prescribed current of 5 to 30 V to the gate electrode. In this embodiment, voltage is situated as 10 V in a nitric acid solution (30° C.), and anodic oxidation is performed for 20 to 40 minutes. Thickness of the porous anodic oxide is controlled by the time of anodic oxidation. (FIG. 13(C)).

Barrier anodic oxidation is performed after taking the mask 614 off. Here, the substrate is dipped in ethylene glycohol solution of pH 7, containing 1 to 3% tartaric acid. With a platinum electrode as a cathode and an aluminum electrode as an anode, anodic oxidation is proceeded by gradually increasing voltage. In this manner, a minute barrier anodic oxide 616 with high pressure proof is formed.

The gate insulating film 612 is etched by a dry etching method. Here, anodic oxide 615 and 616 is not etched. The gate insulating film 612 only is etched, and etching is finished at the moment the island active layer 611 is exposed. As a result, the gate insulating film 612' under the porous anodic oxide 615 is left unetched. (FIG. 13(D)).

After that, the porous anodic oxide 615 is etched and removed. A P type impurity region 617 is formed by an ion doping method with the gate electrode portion (the gate electrode, the barrier type anodic oxide, and the silicon oxide film) as a mask in which boron is implanted as an impurity in self-align manner to the island active region 611. Here, diborane ($B_2H_6$) is utilized as a doping gas. Dose amount of boron is 1 to $4 \times 10^{15}$ atom/cm$^2$, accelerating voltage is 10 kV. Because accelerating voltage is low, the portion under the gate insulating layer is not doped and boron is not introduced, thus an offset region is formed. (FIG. 13(E)).

Thermal annealing is performed at 350° to 550° C., e.g. at 500° C. for four hours, and the doped impurity is activated. To help activation, KrF excimer laser (wavelength 248 nm, pulse width 20 nsec) is irradiated. It is appropriate energy density of laser is 200 to 400 mJ/cm$^2$, preferably 250 to 300 mJ/cm$^2$. Here, PI junction under the gate insulating film 612' is fully activated by laser irradiation. Activation can be performed here by thermal annealing.

A silicon oxide film is formed as an interlayer insulating film 618 by 3000 Å thickness by a plasma CVD method.

The interlayer insulating film 618 is etched, and a contact hole is formed in a source region. An aluminum film is formed by a sputtering method, and is patterned, thus a source electrode 619 is formed. (FIG. 13(F)).

In the end, a silicon nitride film as a passivation film 620 is formed by 1000 to 6000 Å thickness, e.g. 3000 Å thickness by a plasma CVD method. By etching this silicon nitride film and the interlayer insulating film 618, a contact hole is formed in a drain. After that, an indium tin oxide film (ITO film) is formed and is etched, thus a pixel 621 is formed. (FIG. 13(G)).

In the manner as above mentioned, a pixel TFT with a P channel offset region is formed.

EXAMPLE 11

This example is to be explained with FIG. 14. As a substrate, Corning 1733 glass is utilized. First of all, a base film is formed on a glass substrate 701. An aluminum nitride film 702 is formed by 1000 Å thickness by a sputtering method on the substrate, and then a silicon oxide film 703 is formed by 1000 Å thickness by a plasma CVD method. Thus a base film comprising these two layers is formed. The aluminum nitride film 702 is formed to prevent pollution by movable ions in the glass substrate.

The substrate is annealed in an atmosphere of nitrogen ($N_2$) at 700° C. which is not lower than the strain point for an hour, and is gradually cooled to 600° C. at 0.2° C./min. An amorphous silicon film (non-single crystal silicon film) 704 is deposited by a plasma CVD method by 300 to 800 Å thickness, for example, by 500 Å. A mask 705 of silicon oxide then is formed by 1000 Å thickness. A nickel acetate film 706 is formed by a spin coating method utilizing nickel acetate solution. (FIG. 14(A)).

Thermal annealing is performed at 550° C. for eight hours, and an amorphous silicon film (non-single crystal silicon film) 704 is crystallized. Crystal growth proceeds in the parallel direction with the substrate as shown by an arrow.

After the mask is removed, laser crystallization is performed to improve crystal characteristics. By irradiating KrF excimer laser light at 200 to 300 mJ/cm$^2$, a crystalline silicon film 707 is obtained. (FIG. 14(B)). The crystalline silicon film 707 is patterned, and an island active layer region 711 is formed. Like Embodiment 10, the active layer is formed avoiding regions with high concentration of nickel.

A silicon oxide film is formed by 200 to 3000 Å thickness, e.g. 1200 Å as a gate insulating film 712 by a plasma CVD method.

An aluminum film of 1000 Å to 3 μm thickness, e.g. 6000 Å thickness is formed by a sputtering method. Like Example 10, a gate electrode 713, a photoresist mask 714, porous oxide 715 are formed. (FIG. 14(C)).

The mask 714 is taken off and barrier anodic oxidation is performed, and barrier anodic oxide 716 is formed. The gate insulating film is etched by a dry etching method. As a result, the gate insulating film 712' under the porous anodic oxide 716 remains. (FIG. 14(D)).

After that, the porous anodic oxide 715 is etched and removed. A P type impurity region 717 is formed by injecting boron as an impurity into the island active layer region 711 in self-align manner with utilizing the gate electrode portion (the gate electrode, the barrier anodic oxide, the silicon oxide film) as a mask. (FIG. 14(E)).

The impurity region 717 is activated by irradiating KrF excimer laser light (wavelength 248 nm, pulse width 20 nsec). To ameliorate a junction between source and channel and a junction between drain and channel, thermal annealing is performed for four hours at 350° to 550° C., e.g. 500° C. A silicon oxide film is formed as an interlayer insulating film 718 by 3000 Å thickness by a plasma CVD method.

The interlayer insulating film 718 is etched, and a contact hole is formed in a source region. An aluminum film is formed by a sputtering method, and is patterned, thus a source electrode 719 is formed. (FIG. 14(F)).

In the end, a silicon nitride film as a passivation film 720 is formed by 2000 to 6000 Å thickness, e.g. 3000 Å thickness by a plasma CVD method. By etching this silicon nitride film and the interlayer insulating film 718, a contact hole is formed in a drain. After that, an indium tin oxide film (ITO film) is formed and is etched, thus a pixel 721 is formed. (FIG. 14(G)).

In the manner as above mentioned, a pixel TFT with a P channel offset region is formed.

EXAMPLE 12

This example is to be explained with FIG. 15. As a substrate, Corning 7059 glass is utilized. First of all, a base film is formed on a glass substrate 801. A silicon oxide film 802 is formed on the substrate by 1000 Å thickness by a plasma CVD method, and a silicon nitride oxide film 803 is formed by 1000 Å thickness by a plasma CVD method. Thus a base film comprising these two layers is formed.

The substrate is annealed in an atmosphere of ammonia ($NH_3$) at 640° C. which is not lower than the strain point for an hour, and is gradually cooled to 400° C. at 0.2° C./min. An amorphous silicon film (non-single crystal silicon film) 804 is deposited by a plasma CVD method by 300 to 800 Å thickness, for example, by 500 Å. A mask 805 of silicon oxide then is formed by 1000 Å thickness. A nickel acetate film 806 is formed by a spin coating method utilizing nickel acetate solution. (FIG. 15(A)).

Thermal annealing is performed at 550° C. for eight hours, and an amorphous silicon film (non-single crystal silicon film) 804 is crystallized. Crystal growth proceeds in the parallel direction with the substrate as shown by an arrow.

After the mask is removed, laser crystallization is performed to improve crystal characteristics. By irradiating KrF excimer laser light at 200 to 300 mJ/cm², a crystalline silicon film 807 is obtained. (FIG. 15(B)). The crystalline silicon film 807 is patterned, and an island active layer region 811 is formed. Like Example 10, the active layer is formed avoiding regions with high concentration of nickel. Though etching is performed by RIE method, etching rate of the silicon nitride oxide film 803 is much lower than that of the silicon film, thus overetch of the base film is small.

A silicon oxide film is formed by 200 to 3000 Å thickness, e.g. 1200 Å as a gate insulating film 812 by a plasma CVD method.

An aluminum film of 1000 Å to 3 μm thickness, e.g. 6000 Å thickness is formed by a sputtering method. Like the method in Example 10, a gate electrode 813, a photoresist mask 814, and porous anodic oxide 815 are formed. (FIG. 15(C)).

Barrier anodic oxidation is performed after the mask 814 is taken off, and barrier anodic oxide 816 is formed. As a result of etching the gate insulating film by a dry etching method, the gate insulating film 812' under the porous anodic oxide 816 remains. (FIG. 15(D)).

After that, the porous anodic oxide 815 is etched and removed. A P type impurity region 817 is formed by an ion doping method with the gate electrode portion (the gate electrode, the barrier type anodic oxide, the silicon oxide film) as a mask in which boron is implanted as an impurity in self-align manner to the island active region 811. (FIG. 15(E)). Thermal annealing is performed at 350° to 550° C., e.g. at 500° C. for four hours, and the doped impurity is activated. To help activation, KrF excimer laser (wavelength 248 nm, pulse width 20 nsec) is irradiated. To improve characteristics of source/channel junction and drain/channel junction, annealing is performed at 350° to 550° C., e.g. 480° C. for an hour. A silicon oxide film is formed as an interlayer insulating film 818 by a plasma CVD method by 3000 Å thickness.

The interlayer insulating film 818 is etched, and a contact hole is formed in a source region. An aluminum film is formed by a sputtering method, and is patterned, thus a source electrode 819 is formed. (FIG. 15(F)).

In the end, a silicon nitride film as a passivation film 820 is formed by 2000 to 6000 Å thickness, e.g. 3000 Å thickness by a plasma CVD method. By etching this silicon nitride film and the interlayer insulating film 818, a contact hole is formed in a drain. After that, an indium tin oxide film (ITO film) is formed and is etched, thus a pixel 821 is formed. (FIG. 15(G)).

In the manner as above mentioned, a pixel TFT with a P channel offset region is formed.

EXAMPLE 13

This example is to be explained according to FIG. 13. As a substrate, NA 45 glass (strain point 610° C.) of NH Technoglass Co. is utilized. The substrate is annealed for an hour in dinitrogen monoxide ($N_2O$) atmosphere at 650° C. which is not lower than the strain point, and then is gradually cooled to 500° C. at 0.2° C./min. A base film is formed on the glass substrate 601 by a plasma CVD method. A silicon nitride film 602 is formed on the substrate by 1000 Å thickness, and a silicon oxide film 603 is formed by 1000 Å thickness. Thus a base film comprising these two layers is formed. The silicon nitride film 602 is formed to prevent pollution by movable ions and the like from the glass substrate.

An amorphous silicon film (non-single crystal silicon film) 604 is deposited by a plasma CVD method by 300 to 800 Å thickness, for example, by 500 Å. A mask 605 of silicon oxide then is formed by 1000 Å thickness. A nickel acetate film 606 is formed by a spin coating method utilizing nickel acetate solution. Concentration of nickel is 50 to 300 ppm, such as 100 ppm. Here, because the nickel acetate film 606 is as very thin as several to several ten Å, this film has not necessarily become a film. (FIG. 13(A)).

Thermal annealing is performed at 550° C. for eight hours, and an amorphous silicon film (non-single crystal silicon film) 604 is crystallized. Crystal growth proceeds in the parallel direction with the substrate as shown by an arrow.

After the mask 605 (it is also a protection film from crystallization annealing)is removed, laser crystallization is performed to improve crystal characteristics. By irradiating KrF excimer laser light (wavelength 248 nm) at 200 to 300 mJ/cm², a crystalline silicon film 607 is obtained. (FIG. 13(B)).

The crystalline silicon film 607 is patterned, and an island active layer region 611 is formed. The region shown as 608 in FIG. 13(B) is the region to which nickel has been directly introduced, and which has nickel at a high concentration. As is shown in Embodiment 4 and 5, nickel also exists at terminal points 609 and 610 of crystal growth at a high concentration. It has been found these regions have nickel at a concentration nearly a digit higher than that of other crystallized regions. In this embodiment, an active layer region being a region for forming an active element, e.g. a pixel TFT is patterned avoiding these regions with high concentration of nickel, and thus the regions with nickel at a high concentration are removed intentionally. Etching of the active layer is performed by RIE method having anisotropy in vertical direction.

A silicon oxide film is formed by 200 to 3000 Å thickness, e.g. 1000 Å as a gate insulating film 612 by a plasma CVD method.

An aluminum (including Si of 1 wt %, or Sc of 0.1 to 0.3 wt %) film of 1000 Å to 3 μm thickness, e.g. 5000 Å thickness is formed by a sputtering method. Photoresist is formed by a spin coating method. By forming an aluminum oxide film of 100 to 1000 Å thickness on the surface by an anodic oxidation method before formation of the photoresist, adhesion of the photoresist becomes better. After that, the photoresist and the aluminum film are patterned, thus a gate electrode 613 is formed. Even after etching is finished, the photoresist is not taken off, and is left as a mask film 614 on the gate electrode 613.

Porous anodic oxidation is performed to this in an electrolyte by flowing an electric current in the electrolyte, and porous anodic oxide 615 is formed by 3000 to 6000 Å e.g. 5000 Å thickness. Porous anodic oxidation is performed by utilizing an oxide solution like citric acid, nitric acid, phosphoric acid, chromic acid, or sulfuric acid of 3 to 20%, and by applying a prescribed current of 5 to 30 V to the gate electrode. In this embodiment, voltage is 10 V in a nitric acid solution (30° C.), and anodic oxidation is performed for 20 to 40 minutes. Thickness of the porous anodic oxide is controlled by the time of anodic oxidation. (FIG. 13(C)).

Barrier anodic oxidation is performed after taking the mask 614 off. Here, the substrate is dipped in ethylene glycohol solution of pH 7, containing 1 to 3% tartaric acid. With a platinum electrode as a cathode and an aluminum electrode as an anode, anodic oxidation is proceeded by gradually increasing voltage. In this manner, a minute barrier anodic oxide 616 with high pressure proof is formed.

The gate insulating film 612 is etched by a dry etching method. Here, anodic oxide 615 and 616 is not etched. The gate insulating film 612 only is etched, and etching is finished at the moment the island active layer 611 is exposed. As a result, the gate insulating film 612' under the porous anodic oxide 615 is left unetched. (FIG. 13(D)).

After that, the porous anodic oxide 615 is etched and removed. A P type impurity region 617 is formed by an ion doping method with the gate electrode portion (the gate electrode, the barrier type anodic oxide, the silicon oxide film) as a mask in which boron is implanted as an impurity in self-align manner to the island active region 611. Here, diborane ($B_2H_6$) is utilized as a doping gas. Dose amount of boron is 1 to $4 \times 10^{15}$ atom/cm$^2$, accelerating voltage is 10 kV. Because accelerating voltage is low, the portion under the gate insulating layer is not doped and boron is not introduced, thus an offset region is formed. (FIG. 13(E)).

Thermal annealing is performed at 350° to 550° C., e.g. at 500° C. for four hours, and the doped impurity is activated. Transformation of the substrate is not big in this process. To help activation, KrF excimer laser light (wavelength 248 nm, pulse width 20 nsec) is irradiated. It is appropriate energy density of laser is 200 to 400 mJ/cm$^2$, preferably 250 to 300 mJ/cm$^2$. Here, PI junction under the gate insulating film 612' is fully activated by laser irradiation.

A silicon oxide film is formed as an interlayer insulating film 618 by 3000 Å thickness by a plasma CVD method.

The interlayer insulating film 618 is etched, and a contact hole is formed in a source region. An aluminum film is formed by a sputtering method, and is patterned, thus a source electrode 619 is formed. (FIG. 13(F)).

In the end, a silicon nitride film as a passivation film 620 is formed by 1000 to 6000 Å thickness, e.g. 3000 Å thickness by a plasma CVD method. By etching this silicon nitride film and the interlayer insulating film 618, a contact hole is formed in a drain. After that, an indium tin oxide film (ITO film) is formed and is etched, thus a pixel 621 is formed. (FIG. 13(G)).

In the manner as above mentioned, a pixel TFT with a P channel offset region is formed.

EXAMPLE 14

This example is explained according to FIG. 14. As a substrate, Corning 1733 glass is utilized. First of all, the substrate is annealed in an nitrogen ($N_2$) atmosphere at 700° C. which is not lower than the strain point for an hour, and is gradually cooled to 600° C. at 0.2° C./min. After that, a base film is formed on a glass substrate 701. Here, an aluminum nitride film 702 is formed on the substrate by a sputtering method by 1000 Å thickness, and a silicon oxide film 703 is formed by a plasma CVD method by 1000 Å thickness. A base film comprising these two layers is formed. The aluminum nitride film 702 is formed to prevent pollution by movable ions and the like in the glass substrate.

An amorphous silicon film 704 is deposited by a plasma CVD method by 300 to 800 Å thickness, for example, by 500 Å. A mask 705 of silicon oxide then is formed by 1000 Å thickness. A nickel acetate film 706 is formed by a spin coating method utilizing nickel acetate solution. (FIG. 14(A)). Thermal annealing is performed to this substrate at 550° C. for eight hours, and an amorphous silicon film 704 is crystallized. As is shown by an arrow, crystal growth proceeds in the parallel direction with the substrate as shown by an arrow.

After the mask is removed, laser crystallization is performed to improve crystal characteristics. By irradiating KrF excimer laser light at 200 to 300 mJ/cm$^2$, a crystalline silicon film 707 is obtained. (FIG. 14(B)). The crystalline silicon film 707 is patterned, and an island active layer region 711 is formed. Like Example 13, an active layer is formed avoiding the regions with high concentration of nickel.

A silicon oxide film of 200 to 3000 Å thickness, e.g. 1200 Å thickness is formed as a gate insulating film 712 by a plasma CVD method.

An aluminum film of 1000 Å to 3 μm thickness, e.g. 6000 Å thickness is formed by a sputtering method. By the same method as in Embodiment 13, a gate electrode 713, a photoresist mask 714, porous anodic oxide 715 are formed. (FIG. 14(C)).

Barrier anodic oxidation is performed by taking the mask 714 off, and a barrier anodic oxide 716 is formed. As a result of etching the gate insulating film by a dry etching method, a gate insulating film 712' under a porous anodic oxide 715 is left. (FIG. 14(D)).

After that, a porous anodic oxide 715 is etched and removed. A P type impurity region 717 is formed by ion doping with utilizing a gate electrode portion (the gate electrode, the barrier anodic oxide, the silicon oxide film) as a mask in which boron is implanted as an impurity in self-align way in the island active region 711. (FIG. 14(E)).

The impurity region 717 is activated by irradiating KrF excimer laser light (wavelength 248 nm, pulse width 20 nsec). To make a junction between source and channel and a junction between drain and channel better, thermal annealing is performed for four hours at 350° to 550° C., e.g. 500° C. A silicon oxide film is formed as an interlayer insulating film 718 by 3000 Å thickness by a plasma CVD method.

The interlayer insulating film 718 is etched, and a contact hole is formed in a source region. An aluminum film is formed by a sputtering method, and is patterned, thus a source electrode 719 is formed. (FIG. 14(F)).

In the end, a silicon nitride film as a passivation film 720 is formed by 2000 to 6000 Å thickness, e.g. 3000 Å thickness by a plasma CVD method. By etching this silicon nitride film and the interlayer insulating film 718, a contact hole is formed in a drain. After that, an indium tin oxide film (ITO film) is formed and is etched, thus a pixel 721 is formed. (FIG. 14(G)).

In the manner as above mentioned, a pixel TFT with a P channel offset region is formed.

EXAMPLE 15

This example is explained according to FIG. 15. As a substrate, Corning 7059 glass is utilized. First of all, the substrate is annealed in an ammonia ($NH_3$) atmosphere at 640° C. which is not lower than the strain point for an hour, and is gradually cooled to 400° C. at 0.2° C./min. After that, a base film is formed on a glass substrate 801. Here, a silicon oxide film 802 is formed by a plasma CVD method by 1000 Å thickness on the substrate, a silicon nitride film 803 is formed by 1000 Å thickness by a plasma CVD method, and thus a base film comprising these two layers is formed.

An amorphous silicon film (non-single crystal silicon film) 804 is deposited by a plasma CVD method by 300 to 800 Å thickness, for example, by 500 Å. A mask 805 of silicon oxide then is formed by 1000 Å thickness. A nickel acetate film 806 is formed by a spin coating method utilizing nickel acetate solution. (FIG. 15(A)). Thermal annealing is performed to this substrate at 550° C. for eight hours, and an amorphous silicon film (non-single crystal silicon film) 804 is crystallized. As is shown by an arrow, crystal growth proceds in the parallel direction with the substrate.

After the mask is removed, laser crystallization is performed to improve crystal characteristics. By irradiating KrF excimer laser light at 200 to 300 mJ/$cm^2$, a crystalline silicon film 807 is obtained. (FIG. 15(B)). The crystalline silicon film 807 is patterned, and an island active layer region 811 is formed. Like Example 13, the active layer is formed avoiding the regions with high concentration of nickel. Here, etching is performed by RIE method to the crystalline silicon film. Because etching rate of the silicon nitride oxide film 803 is much lower than that of the silicon film, overetch on the base film is a little.

A silicon oxide film of 200 to 3000 Å thickness, e.g. 1200 Å thickness is formed as a gate insulating film 812 by a plasma CVD method.

An aluminum film of 1000 Å to 3 μm thickness, e.g. 6000 Å thickness is formed by a sputtering method. By the same method as in Example 13, a gate electrode 813, a photoresist mask 814, porous anodic oxide 815 are formed. (FIG. 15(C)).

Barrier anodic oxidation is performed by taking the mask 814 off, and a barrier anodic oxide 816 is formed. As a result of etching the gate insulating film by a dry etching method, a gate insulating film 812' under a porous anodic oxide 815 is left. (FIG. 15(D)).

After that, a porous anodic oxide 815 is etched and removed. A P type impurity region 817 is formed by ion doping with utilizing a gate electrode portion (the gate electrode, the barrier anodic oxide, the silicon oxide film) as a mask in which boron is implanted as an impurity in self-align way in the island active region 811. (FIG. 15(E)).

Thermal annealing is performed at 350° to 550° C., e.g. at 500° C. for four hours, and the doped impurity is activated. To help activation, KrF excimer laser light (wavelength 248 nm, pulse width 20 nsec) is irradiated. After that, to improve characteristics of source/channel junction and drain/channel junction, annealing is performed at 350° to 550° C., e.g. 480° C. for an hour. A silicon oxide film is deposited by 3000 Å thickness as an interlayer insulating film 818 by a plasma CVD method.

The interlayer insulating film 818 is etched, and a contact hole is formed in a source region. An aluminum film is formed by a sputtering method, and is patterned, thus a source electrode 819 is formed. (FIG. 15(F)).

In the end, a silicon nitride film as a passivation film 820 is formed by 2000 to 6000 Å thickness, e.g. 3000 Å thickness by a plasma CVD method. By etching this silicon nitride film and the interlayer insulating film 818, a contact hole is formed in a drain. After that, an indium tin oxide film (ITO film) is formed and is etched, thus a pixel 821 is formed. (FIG. 15(G)).

In the manner as above mentioned, a pixel TFT with a P channel offset region is formed.

In accordance with the present invention, a glass substrate is previously heat-treated above the transition point. Then, the substrate is slowly cooled to cause it to shrink. Subsequently, the substrate is heat-treated below the strain point of the substrate. The substrate is then rapidly cooled. Thus, shrinkage of the glass substrate can be reduced to a minimum. In the above examples, the description centers on Corning 7059 glass substrate. Obviously, other glass substrates such as Corning 1733, HOYA LE30, HOYA NA35, HOYA NA45, OA2 manufactured by Nippon Electric Glass (NEG) Co., Ltd., Asahi Glass AN1, and Asahi Glass AN2 which are listed in Table 1 can produce similar effects.

Where a substrate is thermally annealed above its strain point and slowly cooled, shrinkage of the substrate during later thermal treatments is reduced greatly. Generally, a patterning step, or a mask alignment step, for introducing nickel as in the illustrated examples requires lower accuracy than other patterning steps. On the other hand, formation of contact holes and patterning for forming gate electrodes require tight tolerances of less than several micrometers. Therefore, in the past, activation of dopants has relied mainly on laser annealing involving substantially no thermal process.

The present invention makes it possible to suppress shrinkage of substrates up to considerably high temperatures. In consequence, means adapted for mass production such as thermal annealing as described in Examples 2 and 5 and lamp annealing as described in Examples 3 and 6 can be adopted. In this way, the invention is quite effective in fabricating semiconductor devices on an insulating substrate.

What is claimed is:

1. A method of fabricating a semiconductor device, comprising the steps of:

forming a bottom film on a glass substrate having a strain point;

thermally annealing said glass substrate at a first temperature higher than said strain point of said glass substrate after said bottom film forming step;

cooling said substrate from said first temperature to a second temperature lower than said strain point at a rate of less than 2° C./min;

forming a semiconductor film comprising silicon on said bottom film; and thermally annealing said substrate at a third temperature not exceeding said strain point of the glass substrate after said semiconductor film forming step, wherein all steps subsequent to said semiconductor film forming step are performed at a temperature less than said strain point.

2. The method of claim 1 wherein at least one patterning step is carried out between said step of forming a silicon film on said bottom film and said step of thermally annealing said substrate at a third temperature.

3. The method of claim 1 wherein a metal element for promoting crystallization is intentionally added to said silicon film.

4. The method of claim 1 wherein said bottom film comprises a silicon oxide layer, a silicon nitride layer, an aluminum nitride layer or a multi-layer thereof formed by plasma-assisted CVD.

5. The method of claim 1 wherein said step of thermally annealing said glass substrate at a first temperature higher than said strain point of said glass substrate is carried out in an oxidizing ambient or a nitriding ambient.

6. The method of claim 1 wherein said thermally annealing step at said third temperature is carried out by a lamp annealing using visible or near infrared light.

7. The method of claim 1 wherein said thermal annealing step at said third temperature is carried out by a laser.

8. The method of claim 1 wherein said thermally annealing step at said third temperature is carried out by thermal and laser energies.

9. A method of fabricating a semiconductor device comprising the steps of:

forming a bottom film on a glass substrate having a strain point;

thermally annealing said glass substrate at a first temperature higher than said strain point of said glass substrate after said bottom film forming step;

cooling said substrate from said first temperature to a second temperature lower than said strain point at a rate of less than 2° C./min;

forming a non-single crystal semiconductor film comprising silicon on said bottom film;

selectively providing in contact with said semiconductor film a catalytic element which promotes crystallization of said semiconductor film;

thermally annealing said substrate at a temperature less than said strain point of said glass substrate and within a range from a temperature 30° C. lower than a crystallization temperature of said semiconductor film to a temperature 30° C. higher than said crystallization temperature;

wherein all steps subsequent to said semiconductor film forming step are performed at a temperature less than said strain point.

10. The method of claim 9 wherein said thermally annealing step at said temperature less than said strain point is carried out by a lamp annealing using visible or near infrared light.

11. The method of claim 9 wherein said thermally annealing step at said temperature less than said strain point is carried out by a laser.

12. The method of claim 9 wherein said thermally annealing step at said temperature less than said stain point is carried out by thermal and laser energies.

13. A method of fabricating a semiconductor device comprising the steps of:

forming a bottom film on a glass substrate having a strain point;

thermally annealing said glass substrate at a first temperature higher than said strain point after said bottom film forming step to shrink said glass substrate 1000 ppm or more;

forming a non-single crystal semiconductor film comprising silicon on said bottom film;

selectively providing in contact with said semiconductor film a catalytic element which promotes crystallization of said semiconductor film; and crystallizing said non-single crystal semiconductor film from a location of said catalytic element by thermal annealing at a temperature less than said strain point of the glass substrate;

wherein all steps subsequent to said semiconductor film forming step are performed at a temperature less than said strain point.

14. The method of claim 13 wherein said crystallizing step is carried out by said thermal annealing and a laser annealing of said non-single crystal semiconductor film after said thermal annealing.

15. The method of claim 13 wherein said crystallizing step is carried out by said thermal annealing and an annealing of said non-single crystal semiconductor film by a visible or near infrared light after said thermal annealing.

16. A method of fabricating a semiconductor device comprising the steps of:

preparing a glass substrate having a strain point;

thermally annealing said glass substrate at a first temperature higher than said strain point of said glass substrate;

cooling said substrate from said first temperature to a second temperature lower than said strain point at a rate of less than 2° C./min;

forming a bottom film on said substrate after said cooling step;

forming a non-single crystal semiconductor film comprising silicon on said bottom film; and heat-treating said substrate and said semiconductor film at a third temperature not higher than said strain point of the glass substrate;

wherein all steps subsequent to said semiconductor film forming step are performed at a temperature less than said strain point.

17. The method of claim 16 wherein said semiconductor film comprises silicon.

18. The method of claim 16 wherein at least one patterning step is carried out between said step of forming a bottom film on said substrate at a third temperature.

19. The method of claim 17 wherein a metal element for promoting crystallization is intentionally added to said silicon film.

20. The method of claim 16 wherein said bottom film comprises a silicon oxide layer, a silicon nitride layer, an aluminum nitride layer or a multi-layer thereof formed by plasma-assisted CVD.

21. A method of fabricating a semiconductor device comprising the steps of:

thermally annealing a glass substrate at a first temperature higher than a strain point of said glass substrate;

forming a bottom film on said glass substrate after said thermally annealing step;

cooling said substrate from said first temperature to a second temperature lower than said strain point at a rate of less than 2° C./min;

forming a non-single crystal semiconductor film comprising silicon on said bottom film;

selectively providing in contact with said semiconductor film a catalytic element which promotes crystallization of said semiconductor film; and thermally annealing said substrate at a temperature less than said strain point of said glass substrate and with a range from a temperature 30° C. lower than a crystallization temperature of said semiconductor film to a temperature 30° higher than said crystallization temperature;

wherein all steps subsequent to said semiconductor film forming step are performed at a temperature less than said strain point.

22. The method of claim 21 wherein said thermally annealing step at said temperature less than said stain point is carried out by a lamp annealing using visible or near infrared light.

23. The method of claim 21 wherein said thermally annealing step at said temperature less than said stain point is carried out by a laser.

24. The method of claim 21 wherein said thermally annealing step at said temperature less than said strain point is carried out by thermal and laser energies.

25. A method of fabricating a semiconductor device comprising the steps of:

thermally annealing a glass substrate at a first temperature higher than a strain point of said glass substrate to shrink said glass substrate;

forming a bottom film on said glass substrate after said thermally annealing step;

forming a non-single crystal semiconductor film comprising silicon on said bottom film;

selectively or wholly providing in contact with said semiconductor film a catalytic element which promotes crystallization of said semiconductor film; and crystallizing said semiconductor film from a location of said catalytic element by thermal annealing at a temperature less than said strain point of the glass substrate;

wherein all steps subsequent to said semiconductor film forming step are performed at a temperature less than said strain point.

26. A method of heat-treating a substrate, comprising the steps of:

heating said substrate at a temperature greater than the strain point of the substrate while holding said substrate substantially within ±30° from horizontal;

cooling said substrate at a rate of 2° C./min or less;

forming a buffer layer on said substrate after said cooling step; and forming a semiconductor film comprising silicon on said buffer layer; and processing said semiconductor film at a temperature less than said strain point;

wherein all steps subsequent to said semiconductor film forming step are performed at a temperature less than said strain point.

27. The method of claim 26 wherein said substrate is held substantially horizontal.

28. The method of claim 26 wherein said substrate is made of glass having a strain point, and wherein said substrate is heated above said strain point.

29. The method of claim 26 wherein said buffer layer is a film of silicon oxide.

30. The method of claim 26 further comprising the step of cooling said substrate at a rate of 0.1° to 0.5° C./min in an ambient of nitrogen, ammonia, dinitrogen monoxide or oxygen stream after said step of heating said substrate to shrink said substrate.

31. The method of claim 26 wherein said substrate is made of glass, and wherein said semiconductor film is formed as said semiconductor film over said glass substrate with a buffer layer interposed therebetween.

32. The method of claim 31 wherein said silicon film is doped with an impurity for promoting crystallization and is crystallized by being heated.

33. The method of claim 26 wherein a silicon film in the form of an island is formed on said substrate.

34. The method of claim 26 wherein said semiconductor film is formed over said substrate made of glass with a buffer layer interposed therebetween, and wherein a thin-film transistor is formed, using said semiconductor film.

35. The method of claim 26 wherein a silicon film in the form of an island is formed on said substrate, and wherein said step of processing said substrate is carried out in an oxidizing ambient to form an oxide film on said silicon film.

36. A method of heat-treating a substrate comprising:

a first step of heating said substrate at a first temperature greater than the strain point of the substrate while holding said substrate substantially horizontal;

a second step of heating said substrate at a second temperature lower than said first temperature after said first step;

cooling said substrate at a rate of 10° to 300° C./min at least through said strain point of said substrate;

forming a bottom film on said substrate after said cooling step; and forming a non-single crystal semiconductor film comprising silicon on said bottom film; and processing said semiconductor film at a temperature less than said strain point;

wherein all steps subsequent to said semiconductor film forming step are performed at a temperature less than said strain point.

37. A method of fabricating a semiconductor device on a glass substrate, comprising the steps of:

heat-treating said glass substrate at a temperature higher than the strain point of the glass substrate while holding said substrate substantially within ±30° from horizontal prior to formation of said semiconductor device; and cooling said glass substrate at a rate of 0.01° to 2° C./min in an ambient of nitrogen, ammonia, or dinitrogen monoxide while holding said substrate substantially horizontal;

forming a bottom film on said glass substrate after said cooling step;

forming a non-single crystal semiconductor film on said bottom film; and processing the semiconductor film at a temperature less than the strain point of the glass substrate;

wherein all steps subsequent to said semiconductor film forming step are performed at a temperature less than said strain point.

38. The method of claim 37 wherein said substrate is held substantially horizontal.

39. A method of processing a substrate comprising the steps of:

heat-treating a substrate made of glass at a temperature higher than the strain point of the glass;

cooling said substrate at a rate of 0.01° to 2° C./min after said heat-treating step;

forming a buffer film on said substrate after said cooling step;

forming a non-single crystal semiconductor film comprising silicon on said glass substrate after said cooling step;

selectively or wholly providing in contact with said semiconductor film a catalytic element which promotes crystallization of said semiconductor film before or after said non-single crystal semiconductor film forming step;

heat-treating said substrate together with said semiconductor film to crystallize said semiconductor film at a temperature less than said strain point;

wherein all steps subsequent to said semiconductor film forming step are performed at a temperature less than said strain point.

40. The method of claim 39 wherein during said steps of heat-treating said substrate, said substrate is held substantially horizontal or within ±30 degrees from horizontal.

41. The method of claim 39 further comprising the step of cooling said substrate together with said crystallized silicon film at a rate exceeding 2° C./min.

* * * * *